United States Patent
Sengupta et al.

(10) Patent No.: US 12,155,480 B2
(45) Date of Patent: Nov. 26, 2024

(54) INTERLEAVING TRANSPORT BLOCKS IN BROADCAST TRANSMISSIONS

(71) Applicant: QUALCOMM Incorporated, San Diego, CA (US)

(72) Inventors: Ayan Sengupta, San Diego, CA (US); Alberto Rico Alvarino, San Diego, CA (US); Aamod Khandekar, San Diego, CA (US); Thomas Stockhammer, Bergen (DE)

(73) Assignee: QUALCOMM Incorporated, San Diego, CA (US)

( * ) Notice: Subject to any disclaimer, the term of this patent is extended or adjusted under 35 U.S.C. 154(b) by 362 days.

(21) Appl. No.: 16/949,527

(22) Filed: Nov. 2, 2020

(65) Prior Publication Data

US 2021/0135787 A1    May 6, 2021

Related U.S. Application Data

(60) Provisional application No. 62/930,540, filed on Nov. 4, 2019.

(51) Int. Cl.
*H04L 1/00* (2006.01)
*H04L 5/00* (2006.01)
*H04W 4/06* (2009.01)

(52) U.S. Cl.
CPC .......... *H04L 1/0071* (2013.01); *H04L 1/0068* (2013.01); *H04L 5/0082* (2013.01); *H04W 4/06* (2013.01)

(58) Field of Classification Search
USPC ........................................................ 370/329
See application file for complete search history.

(56) References Cited

U.S. PATENT DOCUMENTS

| 8,189,559 B2* | 5/2012 | Pi ........................ H04L 1/1819 714/752 |
| 10,284,228 B2 | 5/2019 | Im et al. |
| 2005/0239409 A1* | 10/2005 | Oh ........................ H04W 52/12 455/67.11 |
| 2008/0080542 A1* | 4/2008 | Vishwanathan ...... H04L 1/0052 370/412 |
| 2009/0041110 A1* | 2/2009 | Malladi ................ H04L 1/0071 375/240 |

(Continued)

FOREIGN PATENT DOCUMENTS

| EP | 3214780 A1 | 9/2017 |
| WO | 2020032695 A1 | 2/2020 |
| WO | 2020146964 A1 | 7/2020 |

OTHER PUBLICATIONS

International Search Report and Written Opinion—PCT/US2020/070738—ISA/EPO—Feb. 11, 2021.

(Continued)

*Primary Examiner* — Benjamin H Elliott, IV
*Assistant Examiner* — Hooman Houshmand
(74) *Attorney, Agent, or Firm* — Harrity & Harrity, LLP

(57) ABSTRACT

A base station may perform interleaving of parts of a plurality of transport blocks for a broadcast or multicast transmission across a plurality of time intervals. A size of a transport block of the plurality of transport blocks may be scaled by a scaling factor. The base station may transmit the interleaved parts in the plurality of time intervals.

28 Claims, 13 Drawing Sheets

(56) References Cited

U.S. PATENT DOCUMENTS

| | | | |
|---|---|---|---|
| 2014/0153484 A1* | 6/2014 | Kim | H04L 1/0061 370/328 |
| 2014/0254509 A1* | 9/2014 | Chen | H04W 72/12 370/329 |
| 2018/0294917 A1* | 10/2018 | Loncke | H04L 1/0013 |
| 2019/0305913 A1 | 10/2019 | Schierl et al. | |
| 2019/0327032 A1* | 10/2019 | Andersson | H04L 1/1835 |
| 2019/0349116 A1 | 11/2019 | Hosseini et al. | |
| 2020/0052809 A1* | 2/2020 | Hong | H04L 1/1812 |
| 2021/0203446 A1* | 7/2021 | Nimbalker | H04L 1/0067 |

OTHER PUBLICATIONS

Nokia et al., "Scheduling of Multiple DL/UL Transport Blocks", 3GPP Draft, 3GPP TSG RAN WG1 Meeting #96, R1-1901955, 3rd Generation Partnership Project (3GPP), Mobile Competence Centre, 650, Route Des Lucioles, F-06921 Sophia-Anti Polis Cedex, France, vol. RAN WG1. No. Athens, Greece, Feb. 25, 2019-Mar. 1, 2019 Feb. 15, 2019 (Feb. 15, 2019), XP051599648, 4 Pages, Retrieved from the Internet:URL:http://www.3gpp.org/ftp/tsg%5Fran/WG1%5FRL1/TSGR1%5F96/Docs/R1%2D1901955%2Ezip [retrieved on Feb. 15, 2019] section 2.

\* cited by examiner

INTERLEAVING TRANSPORT BLOCKS IN BROADCAST TRANSMISSIONS

CROSS-REFERENCE TO RELATED APPLICATION

This Patent Application claims priority to U.S. Provisional Patent Application No. 62/930,540, filed on Nov. 4, 2019, entitled "INTERLEAVING TRANSPORT BLOCKS IN BROADCAST TRANSMISSIONS," and assigned to the assignee hereof. The disclosure of the prior Application is considered part of and is incorporated by reference into this Patent Application.

FIELD OF THE DISCLOSURE

Aspects of the present disclosure generally relate to wireless communication and to techniques and apparatuses for interleaving transport blocks in broadcast transmissions.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, and/or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless communication network may include a number of base stations (BSs) that can support communication for a number of user equipment (UEs). A user equipment (UE) may communicate with a base station (BS) via the downlink and uplink. The downlink (or forward link) refers to the communication link from the BS to the UE, and the uplink (or reverse link) refers to the communication link from the UE to the BS. As will be described in more detail herein, a BS may be referred to as a Node B, a gNB, an access point (AP), a radio head, a transmit receive point (TRP), a New Radio (NR) BS, a 5G Node B, and/or the like.

The above multiple access technologies have been adopted in various telecommunication standards to provide a common protocol that enables different user equipment to communicate on a municipal, national, regional, and even global level. New Radio (NR), which may also be referred to as 5G, is a set of enhancements to the LTE mobile standard promulgated by the Third Generation Partnership Project (3GPP). NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. However, as the demand for mobile broadband access continues to increase, there exists a need for further improvements in LTE and NR technologies. Preferably, these improvements should be applicable to other multiple access technologies and the telecommunication standards that employ these technologies.

SUMMARY

In some aspects, a method of wireless communication, performed by a base station, may include performing interleaving of parts of a plurality of transport blocks for a broadcast or multicast transmission across a plurality of time intervals, where a size of a transport block of the plurality of transport blocks is scaled by a scaling factor; and transmitting the interleaved parts in the plurality of time intervals.

In some aspects, a method of wireless communication, performed by a user equipment (UE), may include receiving, in a plurality of time intervals, interleaved parts of a plurality of transport blocks for a broadcast or multicast transmission; performing deinterleaving of the interleaved parts of the plurality of transport blocks to identify each transport block of the plurality of transport blocks, where a size of a transport block of the plurality of transport blocks is scaled by a scaling factor; and decoding each transport block of the plurality of transport blocks.

In some aspects, a base station for wireless communication may include memory and one or more processors operatively coupled to the memory. The memory and the one or more processors may be configured to perform interleaving of parts of a plurality of transport blocks for a broadcast or multicast transmission across a plurality of time intervals, where a size of a transport block of the plurality of transport blocks is scaled by a scaling factor; and transmit the interleaved parts in the plurality of time intervals.

In some aspects, a UE for wireless communication may include memory and one or more processors operatively coupled to the memory. The memory and the one or more processors may be configured to receive, in a plurality of time intervals, interleaved parts of a plurality of transport blocks for a broadcast or multicast transmission; perform deinterleaving of the interleaved parts of the plurality of transport blocks to identify each transport block of the plurality of transport blocks, where a size of a transport block of the plurality of transport blocks is scaled by a scaling factor; and decode each transport block of the plurality of transport blocks.

In some aspects, a non-transitory computer-readable medium may store one or more instructions for wireless communication. The one or more instructions, when executed by one or more processors of a base station, may cause the one or more processors to: perform interleaving of parts of a plurality of transport blocks for a broadcast or multicast transmission across a plurality of time intervals, where a size of a transport block of the plurality of transport blocks is scaled by a scaling factor; and transmit the interleaved parts in the plurality of time intervals.

In some aspects, a non-transitory computer-readable medium may store one or more instructions for wireless communication. The one or more instructions, when executed by one or more processors of a UE, may cause the one or more processors to: receive, in a plurality of time intervals, interleaved parts of a plurality of transport blocks for a broadcast or multicast transmission; perform deinterleaving of the interleaved parts of the plurality of transport blocks to identify each transport block of the plurality of transport blocks, where a size of a transport block of the plurality of transport blocks is scaled by a scaling factor; and decode each transport block of the plurality of transport blocks.

In some aspects, an apparatus for wireless communication may include means for performing interleaving of parts of a plurality of transport blocks for a broadcast or multicast transmission across a plurality of time intervals, where a size of a transport block of the plurality of transport blocks is scaled by a scaling factor; and means for transmitting the interleaved parts in the plurality of time intervals.

In some aspects, an apparatus for wireless communication may include means for receiving, in a plurality of time intervals, interleaved parts of a plurality of transport blocks for a broadcast or multicast transmission; means for performing deinterleaving of the interleaved parts of the plurality of transport blocks to identify each transport block of the plurality of transport blocks, where a size of a transport block of the plurality of transport blocks is scaled by a scaling factor; and means for decoding each transport block of the plurality of transport blocks.

Aspects generally include a method, apparatus, system, computer program product, non-transitory computer-readable medium, user equipment, base station, wireless communication device, and/or processing system as substantially described herein with reference to and as illustrated by the accompanying drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements"). These elements may be implemented using hardware, software, or combinations thereof. Whether such elements are implemented as hardware or software depends upon the particular application and design constraints imposed on the overall system.

It should be noted that while aspects may be described herein using terminology commonly associated with 3G and/or 4G wireless technologies, aspects of the present disclosure can be applied in other generation-based communication systems, such as 5G and later, including NR technologies.

Figure 1:
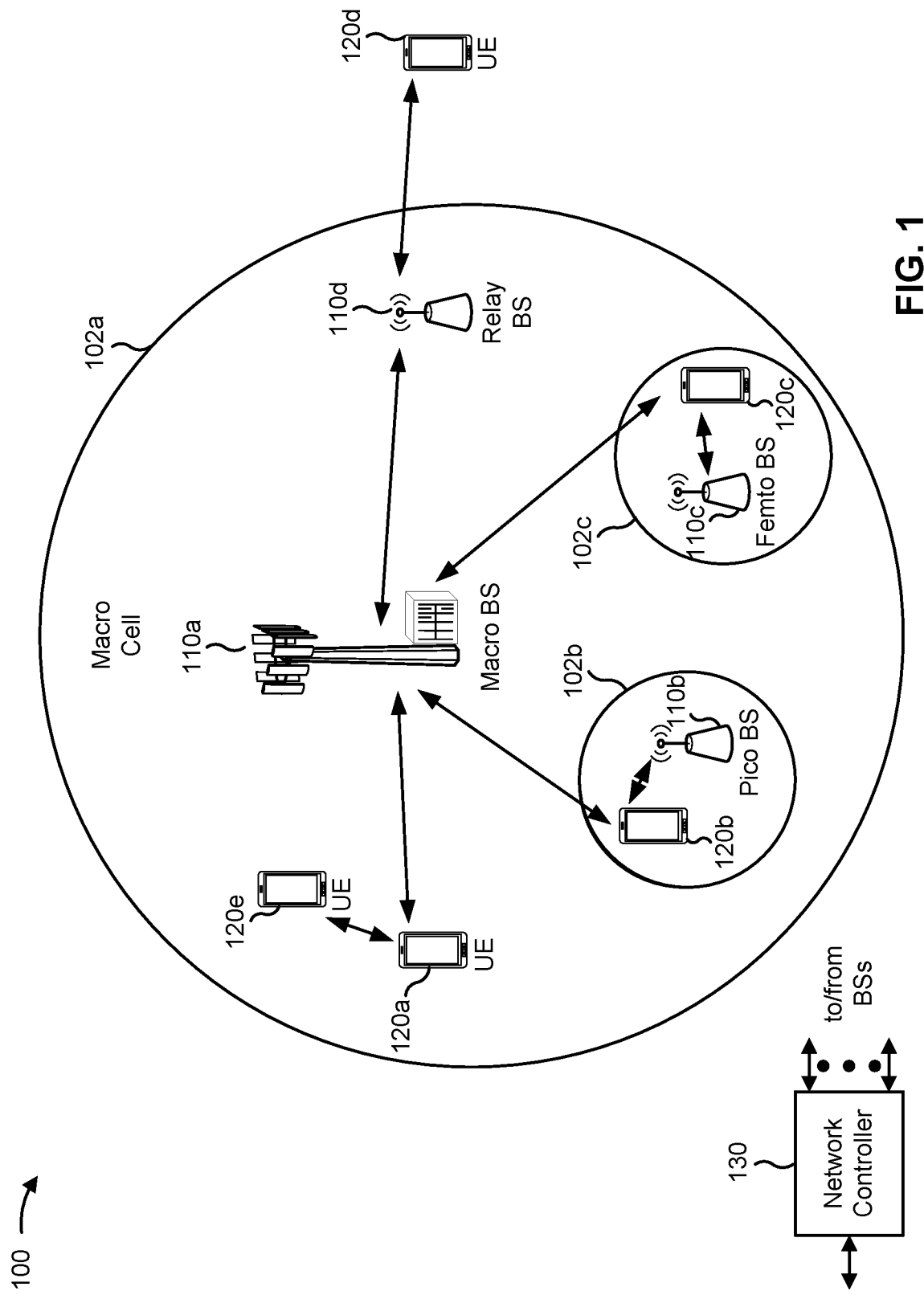
FIG. 1 is a diagram illustrating an example of a wireless communication network, in accordance with various aspects of the present disclosure.

FIG. 1 is a diagram illustrating a wireless network 100 in which aspects of the present disclosure may be practiced. The wireless network 100 may be an LTE network or some other wireless network, such as a 5G or NR network. The wireless network 100 may include a number of BSs 110 (shown as BS 110a, BS 110b, BS 110c, and BS 110d) and other network entities. A BS is an entity that communicates with user equipment (UEs) and may also be referred to as a base station, a NR BS, a Node B, a gNB, a 5G node B (NB), an access point, a transmit receive point (TRP), and/or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). A BS for a macro cell may be referred to as a macro BS. A BS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the wireless network 100 through various types of backhaul interfaces such as a direct physical connection, a virtual network, and/or the like using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay base station 110d may communicate with macro BS 110a and a UE 120d in order to facilitate communication between BS 110a and UE 120d. A relay base station may also be referred to as a relay BS, a relay station, a relay, and/or the like.

Wireless network 100 may be a heterogeneous network that includes BSs of different types, e.g., macro BSs, pico BSs, femto BSs, relay BSs, and/or the like. These different types of BSs may have different transmit power levels, different coverage areas, and different impacts on interference in wireless network 100. For example, macro BSs may have a high transmit power level (e.g., 5 to 40 watts) whereas pico BSs, femto BSs, and relay BSs may have lower transmit power levels (e.g., 0.1 to 2 watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, and/or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, sensors, meters, monitors, location tags, and/or the like, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as NB-IoT (narrowband internet of things) devices. Some UEs may be considered a Customer Premises Equipment (CPE). UE 120 may be included inside a housing that houses components of UE 120, such as processor components, memory components, and/or the like.

In general, any number of wireless networks may be deployed in a given geographic area. Each wireless network may support a particular radio access technology (RAT) and may operate on one or more frequencies. A RAT may also be referred to as a radio technology, an air interface, and/or the like. A frequency may also be referred to as a carrier, a frequency channel, and/or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, and/or the like), a mesh network, and/or the like. In this case, the UE 120 may perform scheduling operations, resource selection operations, and/or other operations described elsewhere herein as being performed by the base station 110.

As indicated above, FIG. 1 is provided as an example. Other examples may differ from what is described with regard to FIG. 1.

Figure 2:
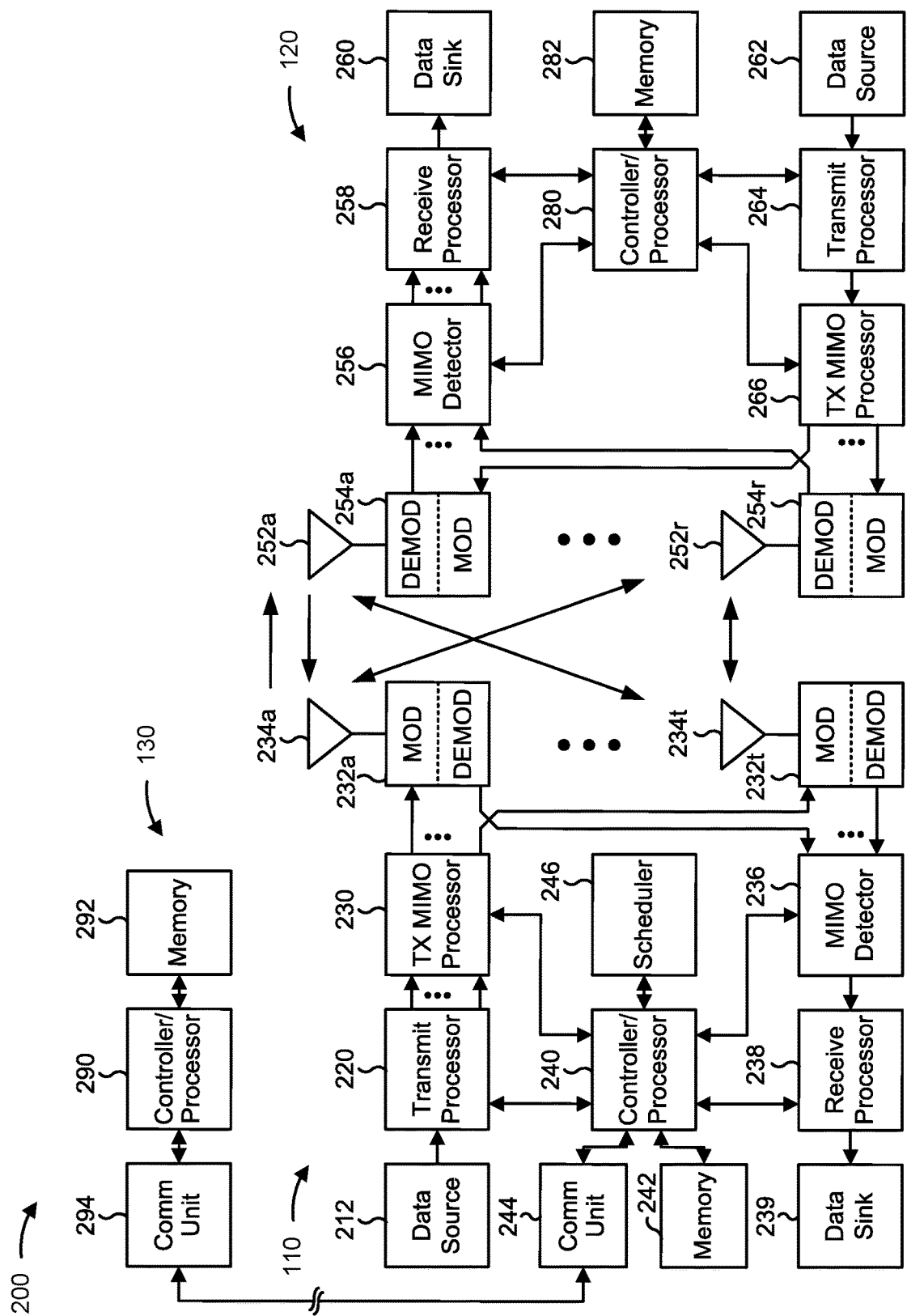
FIG. 2 is a diagram illustrating an example of a base station in communication with a UE in a wireless communication network, in accordance with various aspects of the present disclosure.

FIG. 2 shows a diagram of a design 200 of base station 110 and UE 120, which may be one of the base stations and one of the UEs in FIG. 1. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI) and/or the like) and control information (e.g., CQI requests, grants, upper layer signaling, and/or the like) and provide overhead symbols and control symbols. Transmit processor 220 may also generate reference symbols for reference signals (e.g., the cell-specific reference signal (CRS)) and synchronization signals (e.g., the primary synchronization signal (PSS) and secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM and/or the like) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively. According to various aspects described in more detail below, the synchronization signals can be generated with location encoding to convey additional information.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM and/or the like) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. A channel processor may determine reference signal received power (RSRP), received signal strength indicator (RSSI), reference signal received quality (RSRQ), channel quality indicator (CQI), and/or the like. In some aspects, one or more components of UE 120 may be included in a housing.

On the uplink, at UE 120, a transmit processor 264 may receive and process data from a data source 262 and control information (e.g., for reports comprising RSRP, RSSI, RSRQ, CQI, and/or the like) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM, CP-OFDM, and/or the like), and transmitted to base station 110. At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Network controller 130 may include communication unit 294, controller/processor 290, and memory 292.

Controller/processor 240 of base station 110, controller/processor 280 of UE 120, and/or any other component(s) of FIG. 2 may perform one or more techniques associated with interleaving transport blocks in broadcast transmissions, as described in more detail elsewhere herein. For example, controller/processor 240 of base station 110, controller/processor 280 of UE 120, and/or any other component(s) of FIG. 2 may perform or direct operations of, for example, process 600 of FIG. 6, process 700 of FIG. 7, and/or other processes as described herein. Memories 242 and 282 may store data and program codes for base station 110 and UE 120, respectively. In some aspects, memory 242 and/or memory 282 may comprise a non-transitory computer-readable medium storing one or more instructions for wireless communication. For example, the one or more instructions, when executed by one or more processors of the base station 110 and/or the UE 120, may perform or direct operations of, for example, process 600 of FIG. 6, process 700 of FIG. 7, and/or other processes as described herein. A scheduler 246 may schedule UEs for data transmission on the downlink and/or uplink.

In some aspects, base station 110 may include means for performing interleaving of parts of a plurality of transport blocks for a broadcast or multicast transmission across a plurality of time intervals, where a size of a transport block of the plurality of transport blocks is scaled by a scaling factor, means for transmitting the interleaved parts in the plurality of time intervals, and/or the like. In some aspects, such means may include one or more components of base station 110 described in connection with FIG. 2, such as antenna 234, DEMOD 232, MIMO detector 236, receive processor 238, controller/processor 240, transmit processor 220, TX MIMO processor 230, MOD 232, antenna 234, and/or the like.

In some aspects, UE 120 may include means for receiving, in a plurality of time intervals, interleaved parts of a plurality of transport blocks for a broadcast or multicast transmission, means for performing deinterleaving of the interleaved parts of the plurality of transport blocks to identify each transport block of the plurality of transport blocks, where a size of a transport block of the plurality of transport blocks is scaled by a scaling factor, means for decoding each transport block of the plurality of transport blocks, and/or the like. In some aspects, such means may include one or more components of UE 120 described in connection with FIG. 2, such as controller/processor 280, transmit processor 264, TX MIMO processor 266, MOD 254, antenna 252, DEMOD 254, MIMO detector 256, receive processor 258, and/or the like.

As indicated above, FIG. 2 is provided as an example. Other examples may differ from what is described with regard to FIG. 2.

Figure 3A:
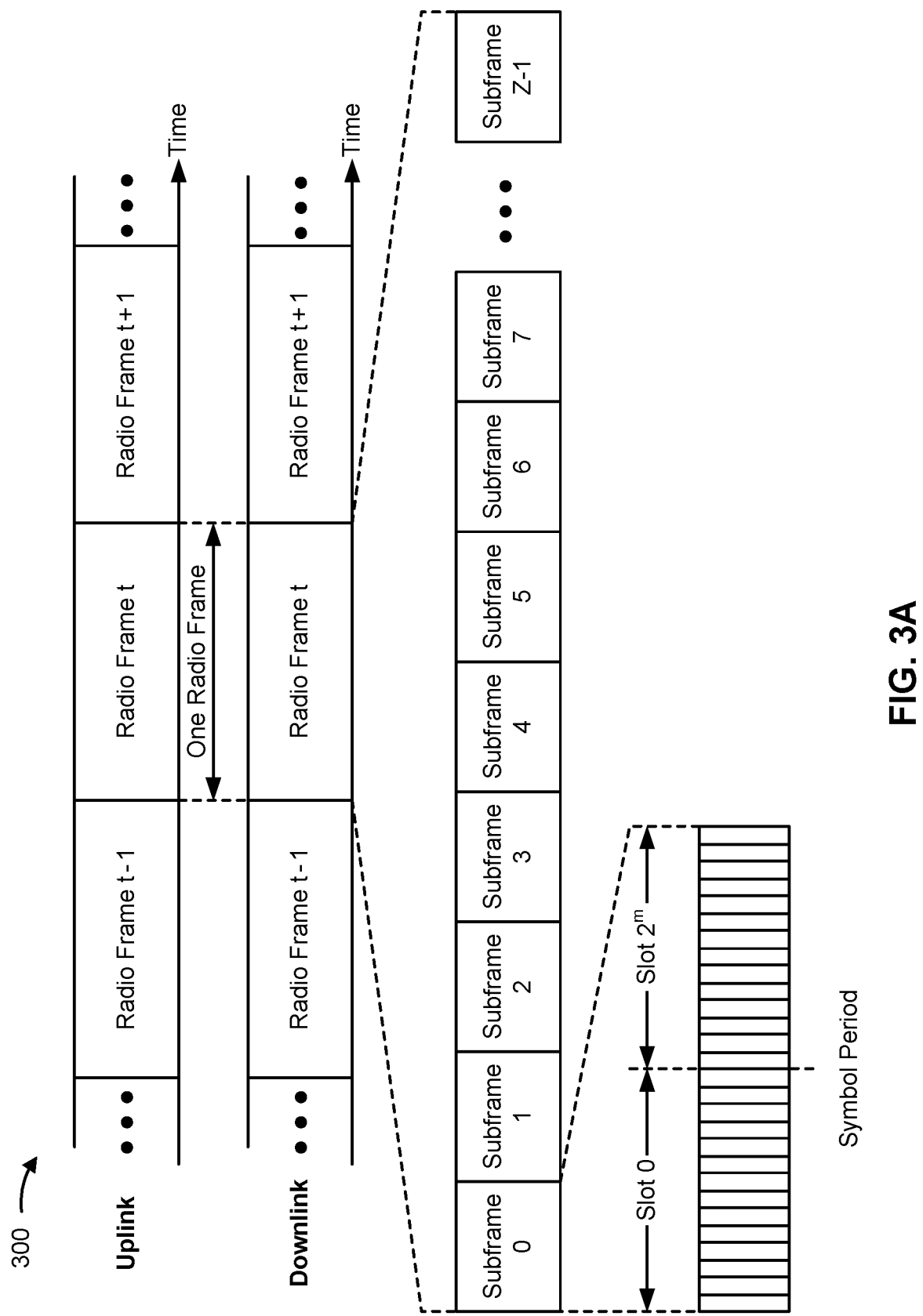
FIG. 3A is a diagram illustrating an example of a frame structure in a wireless communication network, in accordance with various aspects of the present disclosure.

FIG. 3A shows an example frame structure 300 for frequency division duplexing (FDD) in a telecommunications system (e.g., NR). The transmission timeline for each of the downlink and uplink may be partitioned into units of radio frames (sometimes referred to as frames). Each radio frame may have a predetermined duration (e.g., 10 milliseconds (ms)) and may be partitioned into a set of Z ($Z \geq 1$) subframes (e.g., with indices of 0 through Z−1). Each subframe may have a predetermined duration (e.g., 1 ms) and may include a set of slots (e.g., $2^m$ slots per subframe are shown in FIG. 3A, where m is a numerology used for a transmission, such as 0, 1, 2, 3, 4, and/or the like). Each slot may include a set of L symbol periods. For example, each slot may include fourteen symbol periods (e.g., as shown in FIG. 3A), seven symbol periods, or another number of symbol periods. In a case where the subframe includes two slots (e.g., when m=1), the subframe may include 2L symbol periods, where the 2L symbol periods in each subframe may be assigned indices of 0 through 2L−1. In some aspects, a scheduling unit for the FDD may be frame-based, subframe-based, slot-based, symbol-based, and/or the like.

While some techniques are described herein in connection with frames, subframes, slots, and/or the like, these techniques may equally apply to other types of wireless communication structures, which may be referred to using terms other than "frame," "subframe," "slot," and/or the like in 5G NR. In some aspects, "wireless communication structure" may refer to a periodic time-bounded communication unit defined by a wireless communication standard and/or protocol. Additionally, or alternatively, different configurations of wireless communication structures than those shown in FIG. 3A may be used.

In certain telecommunications (e.g., NR), a base station may transmit synchronization signals. For example, a base station may transmit a primary synchronization signal (PSS), a secondary synchronization signal (SSS), and/or the like, on the downlink for each cell supported by the base station. The PSS and SSS may be used by UEs for cell search and acquisition. For example, the PSS may be used by UEs to determine symbol timing, and the SSS may be used by UEs to determine a physical cell identifier, associated with the base station, and frame timing. The base station may also transmit a physical broadcast channel (PBCH). The PBCH may carry some system information, such as system information that supports initial access by UEs.

In some aspects, the base station may transmit the PSS, the SSS, and/or the PBCH in accordance with a synchronization communication hierarchy (e.g., a synchronization signal (SS) hierarchy) including multiple synchronization communications (e.g., SS blocks), as described below in connection with FIG. 3B.

Figure 3B:
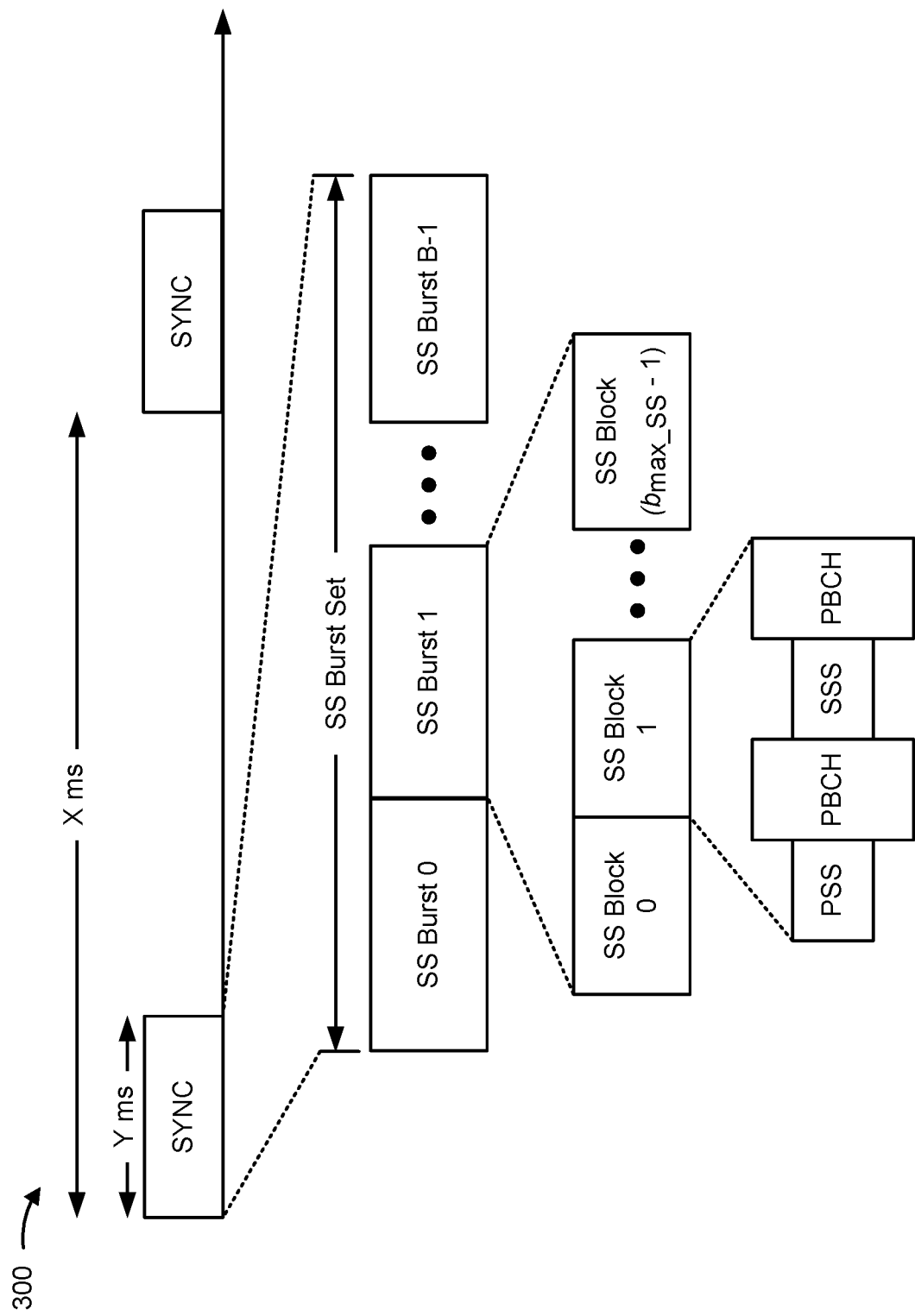
FIG. 3B is a diagram illustrating an example synchronization communication hierarchy in a wireless communication network, in accordance with various aspects of the present disclosure.

FIG. 3B is a diagram illustrating an example SS hierarchy, which is an example of a synchronization communication hierarchy. As shown in FIG. 3B, the SS hierarchy may include an SS burst set, which may include a plurality of SS bursts (identified as SS burst 0 through SS burst B−1, where B is a maximum number of repetitions of the SS burst that may be transmitted by the base station). As further shown, each SS burst may include one or more SS blocks (identified as SS block 0 through SS block ($b_{max\_ss}$−1), where $b_{max\_ss}$−1 is a maximum number of SS blocks that can be carried by an SS burst). In some aspects, different SS blocks may be beam-formed differently. An SS burst set may be periodically transmitted by a wireless node, such as every X milliseconds, as shown in FIG. 3B. In some aspects, an SS burst set may have a fixed or dynamic length, shown as Y milliseconds in FIG. 3B.

The SS burst set shown in FIG. 3B is an example of a synchronization communication set, and other synchronization communication sets may be used in connection with the techniques described herein. Furthermore, the SS block shown in FIG. 3B is an example of a synchronization communication, and other synchronization communications may be used in connection with the techniques described herein.

In some aspects, an SS block includes resources that carry the PSS, the SSS, the PBCH, and/or other synchronization signals (e.g., a tertiary synchronization signal (TSS)) and/or synchronization channels. In some aspects, multiple SS blocks are included in an SS burst, and the PSS, the SSS, and/or the PBCH may be the same across each SS block of the SS burst. In some aspects, a single SS block may be included in an SS burst. In some aspects, the SS block may be at least four symbol periods in length, where each symbol carries one or more of the PSS (e.g., occupying one symbol), the SSS (e.g., occupying one symbol), and/or the PBCH (e.g., occupying two symbols).

In some aspects, the symbols of an SS block are consecutive, as shown in FIG. 3B. In some aspects, the symbols of an SS block are non-consecutive. Similarly, in some aspects, one or more SS blocks of the SS burst may be transmitted in consecutive radio resources (e.g., consecutive symbol periods) during one or more slots. Additionally, or alternatively, one or more SS blocks of the SS burst may be transmitted in non-consecutive radio resources.

In some aspects, the SS bursts may have a burst period, whereby the SS blocks of the SS burst are transmitted by the base station according to the burst period. In other words, the SS blocks may be repeated during each SS burst. In some aspects, the SS burst set may have a burst set periodicity, whereby the SS bursts of the SS burst set are transmitted by the base station according to the fixed burst set periodicity. In other words, the SS bursts may be repeated during each SS burst set.

The base station may transmit system information, such as system information blocks (SIBs) on a physical downlink shared channel (PDSCH) in certain slots. The base station may transmit control information/data on a physical downlink control channel (PDCCH) in C symbol periods of a slot, where B may be configurable for each slot. The base station may transmit traffic data and/or other data on the PDSCH in the remaining symbol periods of each slot.

As indicated above, FIGS. 3A and 3B are provided as examples. Other examples may differ from what is described with regard to FIGS. 3A and 3B.

Figure 4:
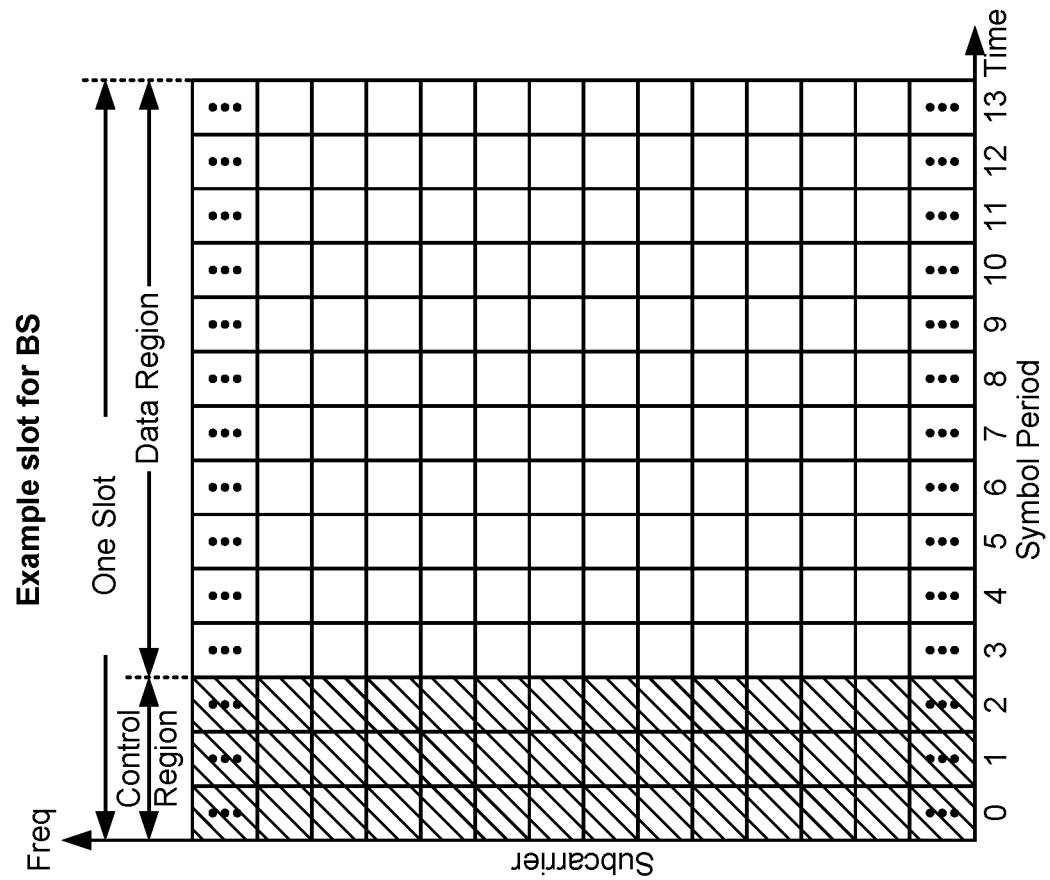
FIG. 4 is a diagram illustrating an example slot format with a normal cyclic prefix, in accordance with various aspects of the present disclosure.

FIG. 4 shows an example slot format 410 with a normal cyclic prefix. The available time frequency resources may be partitioned into resource blocks. Each resource block may cover a set of subcarriers (e.g., 12 subcarriers) in one slot and may include a number of resource elements. Each resource element may cover one subcarrier in one symbol period (e.g., in time) and may be used to send one modulation symbol, which may be a real or complex value.

An interlace structure may be used for each of the downlink and uplink for FDD in certain telecommunications systems (e.g., NR). For example, Q interlaces with indices of 0 through Q−1 may be defined, where Q may be equal to 4, 6, 8, 10, or some other value. Each interlace may include slots that are spaced apart by Q frames. In particular, interlace q may include slots q, q+Q, q+2Q, etc., where $q \in \{0, \ldots, Q-1\}$.

A UE may be located within the coverage of multiple BSs. One of these BSs may be selected to serve the UE. The serving BS may be selected based at least in part on various criteria such as received signal strength, received signal quality, path loss, and/or the like. Received signal quality may be quantified by a signal-to-noise-and-interference ratio (SNIR), or a reference signal received quality (RSRQ), or some other metric. The UE may operate in a dominant interference scenario in which the UE may observe high interference from one or more interfering BSs.

While aspects of the examples described herein may be associated with NR or 5G technologies, aspects of the present disclosure may be applicable with other wireless communication systems. New Radio (NR) may refer to radios configured to operate according to a new air interface (e.g., other than Orthogonal Frequency Divisional Multiple Access (OFDMA)-based air interfaces) or fixed transport layer (e.g., other than Internet Protocol (IP)). In aspects, NR may utilize OFDM with a CP (herein referred to as cyclic prefix OFDM or CP-OFDM) and/or SC-FDM on the uplink, may utilize CP-OFDM on the downlink and include support for half-duplex operation using time division duplexing (TDD). In aspects, NR may, for example, utilize OFDM with a CP (herein referred to as CP-OFDM) and/or discrete Fourier transform spread orthogonal frequency-division multiplexing (DFT-s-OFDM) on the uplink, may utilize CP-OFDM on the downlink and include support for half-duplex operation using TDD. NR may include Enhanced Mobile Broadband (eMBB) service targeting wide bandwidth (e.g., 80 megahertz (MHz) and beyond), millimeter wave (mmW) targeting high carrier frequency (e.g., 60 gigahertz (GHz)), massive MTC (mMTC) targeting non-backward compatible MTC techniques, and/or mission critical targeting ultra reliable low latency communications (URLLC) service.

In some aspects, a single component carrier bandwidth of 100 MHz may be supported. NR resource blocks may span 12 sub-carriers with a sub-carrier bandwidth of 60 or 120 kilohertz (kHz) over a 0.1 millisecond (ms) duration. Each radio frame may include 40 slots and may have a length of 10 ms. Consequently, each slot may have a length of 0.25 ms. Each slot may indicate a link direction (e.g., DL or UL) for data transmission and the link direction for each slot may be dynamically switched. Each slot may include DL/UL data as well as DL/UL control data.

Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based interface. NR networks may include entities such as central units or distributed units.

As indicated above, FIG. 4 is provided as an example. Other examples may differ from what is described with regard to FIG. 4.

A cellular broadcast service may be used to allow one or more base stations to broadcast communications for receipt by any UEs in a geographical area (for example, one or more cells) covered by the broadcast (such that any UE located in the one or more cells can receive the broadcast communications). An example of a cellular broadcast service is a television service. In some cases, the performance of cellular broadcast services (e.g., cellular broadcast services in a legacy network, such as an LTE network) may be adversely affected in a high mobility scenario, such as when a UE is located in a moving vehicle, or other similar scenarios. In such cases, a deep fade of one or more subframes, such as may occur when a UE is in a high mobility scenario, may result in the UE failing to receive one or more transport blocks (TBs) of a broadcast transmission. Moreover, some cellular broadcast services may lack a mechanism for time diversity of communications (e.g., retransmission of failed communications), thereby resulting in the failure of the broadcast transmission.

Some techniques and apparatuses described herein provide improved time diversity for broadcast communications. For example, parts of a plurality of TBs associated with a broadcast transmission may be interleaved across a plurality of subframes. In this way, the parts of a particular TB may be distributed across several subframes (e.g., non-consecutive subframes) occurring over a time period. Accordingly, performance of the TB and reliability of the broadcast transmission may be improved. As described above, while the description herein is in terms of subframes, other time intervals, such as slots, may be used in connection with the techniques and apparatuses described herein.

Figure 5A:
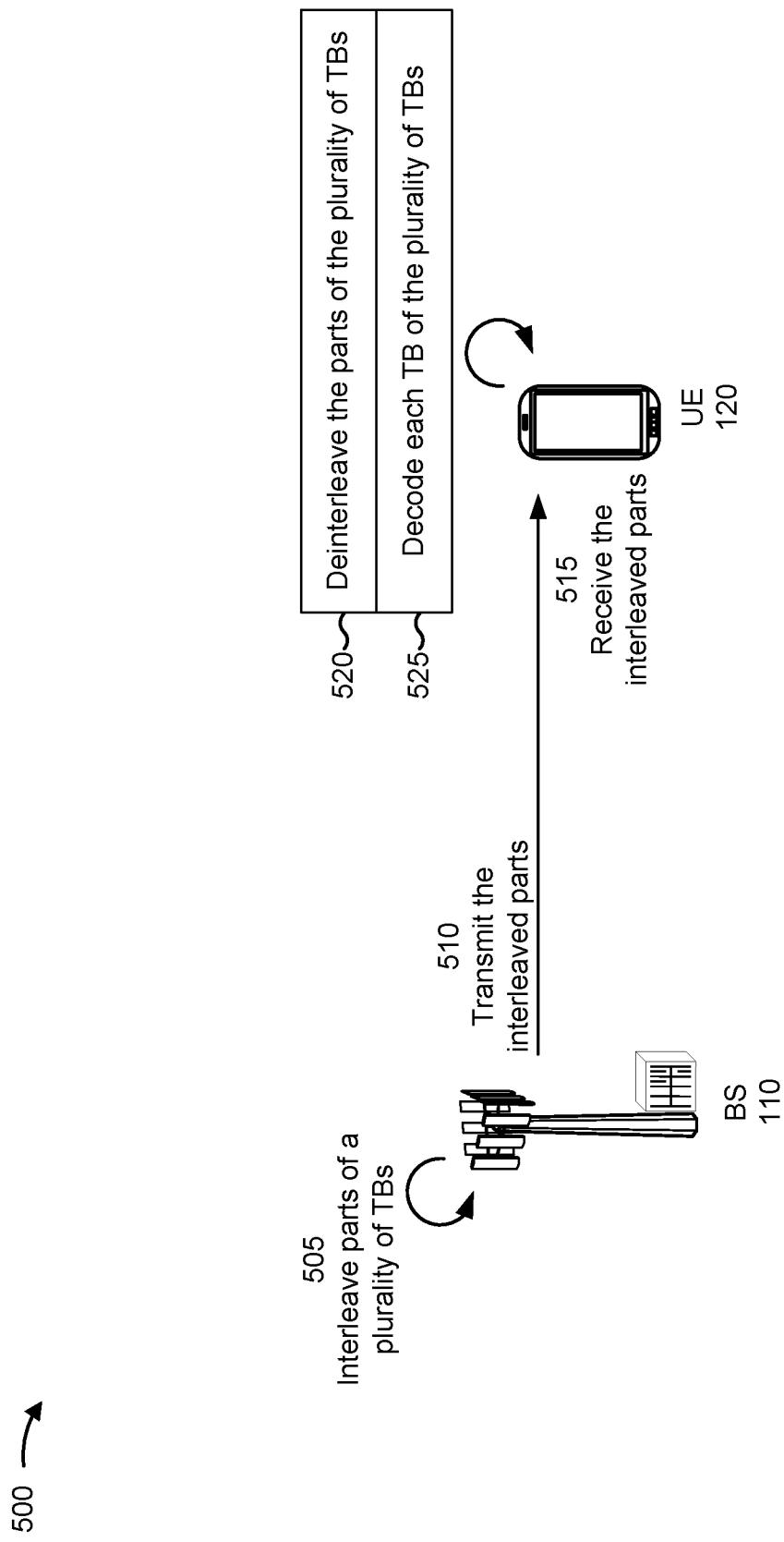
FIGS. 5A and 5B are diagrams illustrating examples of interleaving transport blocks in broadcast transmissions, in accordance with various aspects of the present disclosure.

FIG. 5A is a diagram illustrating an example 500 of interleaving TBs in broadcast transmissions, in accordance with various aspects of the present disclosure. As shown in FIG. 5A, a BS 110 and a UE 120 may communicate in connection with a broadcast transmission. In some aspects, BS 110 may be associated with a multicast broadcast single frequency network (MBSFN). In some aspects, BS 110 may be associated with a broadcast system (e.g., a broadcast system associated with a service provider, such as a television service provider) that uses a carrier of a particular bandwidth for broadcast communications.

In some aspects, BS 110 may have a broadcast transmission that is to be broadcast to one or more UEs, such as UE 120. In such cases, the broadcast transmission may be associated with a plurality of TBs (of a quantity m). While example 500 is described in terms of a broadcast transmission, the techniques and apparatuses described herein may be equally applicable to a multicast transmission, a groupcast transmission, and/or the like.

As shown by reference number 505, BS 110 may perform interleaving of parts of the plurality of TBs. In some aspects, a part of a TB may be a set of bits (e.g., consecutive bits) of the TB. Moreover, a TB may have a quantity of parts that corresponds to a quantity of subframes (n) that are to carry the parts of the TB. In some aspects, the quantity of subframes (n) that are to carry the parts of the TB may be greater than one (e.g., the parts of the TB may be carried in multiple subframes). In some aspects, BS 110 may perform interleaving of the parts of the plurality of TBs across a plurality of subframes (e.g., of a quantity m×n). Moreover, a subframe of the plurality of subframes may carry only a part of a single TB of the plurality of TBs. In this way, the parts of a TB of the plurality of TBs may be distributed (e.g., in the subframes that are to carry the parts of the TB) over the plurality of subframes.

BS 110 may perform interleaving of the parts of the plurality of TBs according to an interleaving procedure. For example, the interleaving procedure may be according to an interleaving pattern, an interleaving algorithm, and/or the like. For example, BS 110 may use an interleaving pattern to space the subframes (of a quantity n), that are to carry the parts of a TB, from each other over the plurality of subframes (of a quantity m×n). That is, BS 110 may use the interleaving pattern so that the subframes, that are to carry the parts of the TB, are non-consecutive. Example interleaving patterns are provided in FIG. 5B.

In some aspects, according to the interleaving procedure, BS 110 may map the parts of a TB of the plurality of TBs to the multiple subframes (of a quantity n) in which the parts are to be transmitted. For example, based at least in part on a determination of the multiple subframes in which the parts of a TB are to be transmitted (e.g., based on the interleaving procedure that is to be used), BS 110 may map the parts of the TB to the multiple subframes first by frequency and then by subframe. For example, BS 110 may map the parts of the TB first to one or more resource elements of a first subframe of the multiple subframes, then to one or more resource elements of a second subframe of the multiple subframes, and so forth. As an example, if the parts of the TB are to be transmitted in the first and second symbols of first and second subframes, BS 110 may map the parts to resource elements (e.g., from lowest to highest frequency) in the first symbol of the first subframe, then to resource elements in the second symbol of the first subframe, then to the first symbol of the second subframe, and then to the second symbol of the second subframe.

In some aspects, the symbols to which the parts of a TB are mapped may be symbols assigned for broadcast data traffic (e.g., symbols associated with a multicast traffic channel (MTCH) of a physical multicast channel (PMCH)). In other words, the procedures described herein may be applicable to TBs for a MTCH. In some aspects, the procedures described herein may be inapplicable to TBs of a multicast control channel (MCCH) or MSI of the PMCH, which may be mapped to resource elements according to legacy procedures.

In some aspects, BS 110 may perform interleaving of the parts of the plurality of TBs after performing other processing of the plurality of TBs, such as layer mapping, precoding, and/or the like. In some aspects, the bits of each TB of the plurality of TBs may be interleaved (e.g., within the TB) before the parts of the plurality of TBs are interleaved.

For example, BS 110 may rate match the bits of a TB of the plurality of TBs to resource elements in multiple subframes (of a quantity n). That is, BS 110 may rate match respective bits of each TB of the plurality of TBs to resource elements in multiple subframes. In other words, the bits of a TB of the plurality of TBs may be mapped to multiple subframes. In some aspects, BS 110 may scale a size of the TB (e.g., relative to a transmission that does not use the interleaving described herein) to enable mapping of the TB to multiple subframes. For example, in such cases, BS 110 may scale the size of the TB by a scaling factor that corresponds to the quantity of the multiple subframes (n). As another example, BS 110 may scale the size of the TB by a fixed scaling factor (e.g., including unity).

The resource elements to which bits are rate matched may be resource elements that are available to the broadcast transmission (e.g., based on an assigned frequency spectrum for broadcast transmissions). In some aspects, the bits of a TB that are to be rate matched may be coded bits. For example, BS 110 may perform channel encoding of the bits of the TB prior to rate matching of the bits.

BS 110 may perform interleaving of the rate-matched bits of a TB of the plurality of TBs. That is, BS 110 may interleave respective rate-matched bits of each TB of the plurality of TBs to obtain a plurality of interleaved TBs (e.g., of a quantity m). For example, BS 110 may interleave the rate-matched bits of a first TB, and may interleave the rate-matched bits of a second TB, respectively (i.e., the bits of the first TB and the bits of the second TB are not interleaved together). Accordingly, the parts of the plurality of TBs that are interleaved may be parts of the plurality of interleaved TBs.

BS 110 may interleave rate-matched bits of a TB according to another interleaving procedure. For example, the other interleaving procedure may be according to an interleaving pattern, an interleaving algorithm, and/or the like. In some aspects, the other interleaving procedure may provide interleaving of rate-matched bits of a TB in a pseudo-random manner, such that codewords of the TB are evenly distributed within the TB. In some aspects, BS 110 may interleave rate-matched bits of a TB on a per-bit basis or on a per-set of bits (e.g., multiple bits) basis. For example, a set of bits may correspond to a quantity of bits mapped to a resource element or a set of resource elements (e.g., according to the rate matching, described above). In some aspects, the other interleaving procedure may be based at least in part on the bandwidth of the broadcast system.

In some aspects, the parts of the plurality of TBs may be associated with redundancy versions (e.g., repetitions) of the plurality of TBs. That is, the parts of a TB of the plurality of TBs may be respectively associated with a plurality of redundancy versions. Accordingly, in some aspects, BS 110, when interleaving the parts of the plurality of TBs, may interleave the redundancy versions of the plurality of TBs.

In some aspects, each redundancy version for a TB of the plurality of TBs may correspond to bits associated with each codeblock of the TB. For example, each codeblock of the TB may be associated with a circular buffer that stores channel coded bits for the codeblock. Accordingly, a redundancy version may be associated with respective subsets of bits from each circular buffer.

In some aspects, BS 110 may map the respective subsets of bits to a subframe of multiple subframes that are to carry the TB. For example, BS 110 may map first respective subsets of bits, corresponding to redundancy version zero of the TB, to a first subframe of the multiple subframes; may map second respective subsets of bits, corresponding to redundancy version one of the TB, to a second subframe of the multiple subframes; and so forth.

In some aspects, BS 110 may use a starting pointer and an ending pointer to identify a subset of bits from a circular buffer. In some aspects, a quantity of bits in the respective subsets of bits (e.g., from each circular buffer) may correspond to a quantity of available resource elements in a subframe of the multiple subframes. In some aspects, BS 110 may use starting pointers for the circular buffers for a particular redundancy version that are the same across the codeblocks of the TB. For example, a starting pointer to identify a first subset of bits from a first circular buffer may be the same as a starting pointer to identify a second subset of bits from a second circular buffer, and so forth.

In some aspects, after mapping first respective subsets of bits (e.g., from each circular buffer) to a first subframe of the multiple subframes, BS 110 may increment (e.g., by 1) an ending pointer associated with the first respective subsets of bits, to obtain a starting pointer for second respective subsets of bits that are to be mapped to a second subframe of the multiple subframes. In some aspects, BS 110 may increment an ending pointer, associated with a codeblock of the TB, having a lowest value among ending pointers associated with the codeblocks of the TB. In this way, BS 110 may map contiguous subsets of bits from the codeblocks of the TB across the multiple subframes. In other words, bits are read out from a circular buffer continuously, without skipping any bits when bits are mapped to a subframe. Accordingly, systematic bits are ensured to be mapped, thereby improving a performance of transmissions at higher coding rates.

As shown by reference number 510, BS 110 may transmit the interleaved parts of the plurality of TBs. That is, BS 110 may transmit a broadcast transmission of the interleaved parts of the plurality of TBs to UE 120 and/or one or more other UEs.

As shown by reference number 515, UE 120 may receive the broadcast transmission of the interleaved parts of the plurality of TBs. For example, UE 120 may receive the interleaved parts of the plurality of TBs in a plurality of subframes (e.g., of a quantity m×n).

In addition, BS 110 may transmit, and UE 120 may receive, a configuration that enables UE 120 to deinterleave the parts of the plurality of TBs. For example, the configuration may identify a quantity of subframes (n) that carry the parts of a TB of the plurality TBs, a quantity of the plurality of TBs (m), a deinterleaving procedure that is to be used to deinterleave the parts of the plurality of TBs, and/or the like. In some aspects, the configuration (e.g., the value of n or m) may be based at least in part on the bandwidth of the broadcast system.

In some aspects, the configuration may be included with the broadcast transmission or included with another broadcast transmission. For example, an MCCH and/or an MSI may include the configuration, and the MCCH and/or the MSI may be carried in the same PMCH, or a different PMCH, as the MTCH carrying the broadcast transmission. In some aspects, the configuration may be transmitted via a system information block.

As shown by reference number 520, UE 120 may perform deinterleaving of the parts of the plurality of TBs in a manner similar to that described above for interleaving of the parts of the plurality of TBs (e.g., in a manner reversed to the interleaving of the parts). For example, UE 120 may perform deinterleaving of the parts of the plurality of TBs to identify each TB of the plurality of TBs. The plurality of TBs may be associated with respective bits (e.g., interleaved bits, as described above). In some aspects, UE 120 may perform deinterleaving of the parts of the plurality of TBs according to a deinterleaving procedure. For example, UE 120 may perform deinterleaving of the parts of the plurality of TBs according to a deinterleaving pattern, as described below in connection with FIG. 5B.

In some aspects, the parts of the plurality of TBs may be redundancy versions of the plurality of TBs, as described above. In such a case, UE 120 may deinterleave the redundancy versions of the plurality of TBs to identify each TB of the plurality of TBs (e.g., in a manner reversed to that described above for interleaving the redundancy versions of the plurality of TBs).

As shown by reference number 525, UE 120 may perform decoding of each identified TB of the plurality of TBs. In some aspects, such as when the bits of the TBs are interleaved (e.g., the respective bits of each identified TB are interleaved), UE 120 may perform deinterleaving of the bits. That is, UE 120 may deinterleave respective bits of the plurality of TBs (e.g., in a manner reversed to the interleaving of the bits, described above). In some aspects, UE 120 may perform deinterleaving of the parts of interleaved TBs according to another deinterleaving procedure. For example, the other deinterleaving procedure may be according to a deinterleaving pattern, a deinterleaving algorithm, and/or the like (e.g., reversed to the other interleaving procedure, described above). In some aspects, UE 120 may de-rate match the bits of a TB of the plurality of TBs (e.g., in a manner reversed to the rate matching of the bits, described above).

Figure 5B:
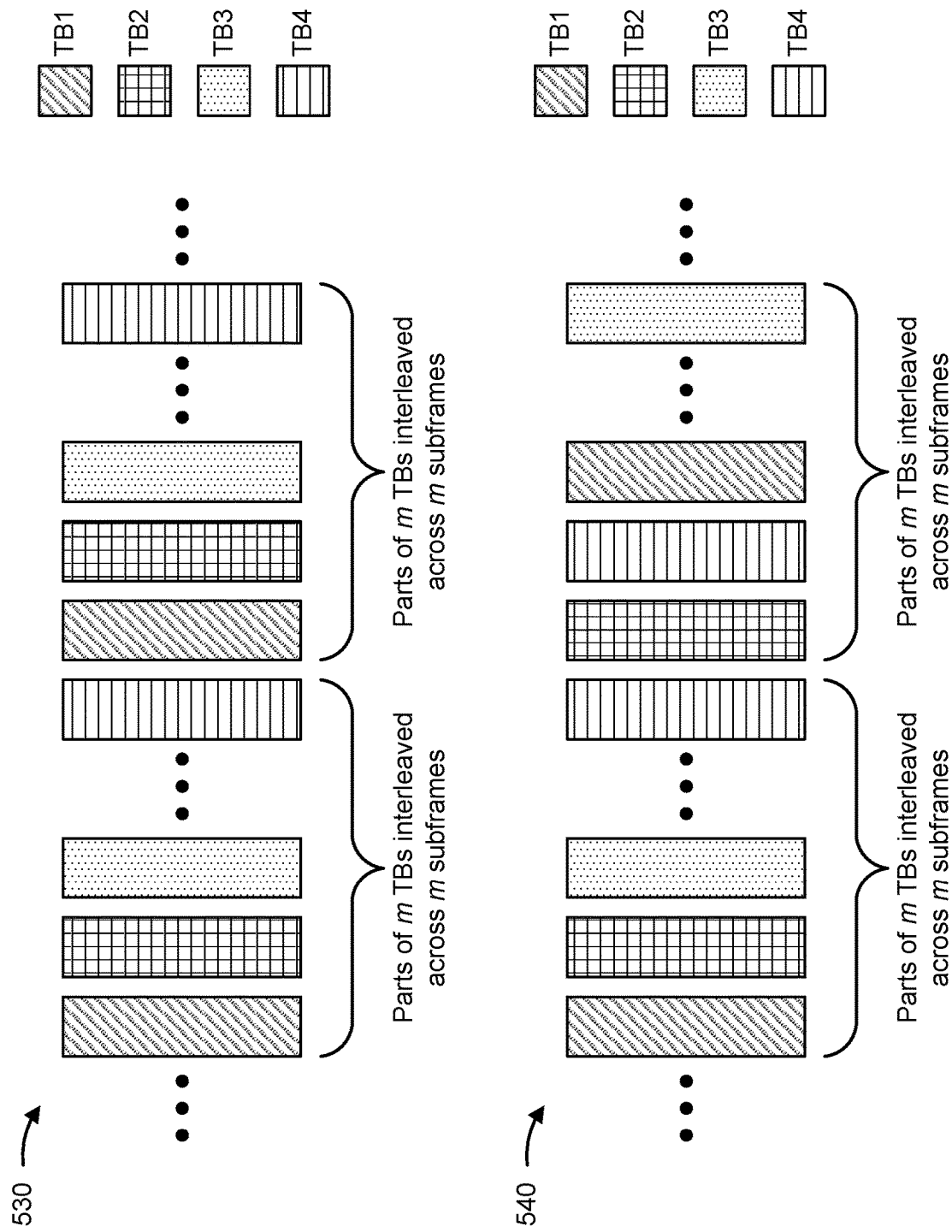

FIG. 5B is a diagram illustrating an example 530 and an example 540 of interleaving TBs in broadcast transmissions, in accordance with various aspects of the present disclosure. In particular, example 530 and example 540 show example interleaving patterns that may be used by BS 110 to interleave the parts of the plurality of TBs and/or example deinterleaving patterns that may be used by UE 120 to deinterleave the parts of the plurality of TBs.

As shown by example 530, in some aspects, the interleaving pattern and/or the deinterleaving pattern may repeat in each set of subframes of the plurality of subframes (e.g., of a quantity m×n). In such a case, a quantity of subframes in a set of subframes may correspond to the quantity of the plurality of TBs (m). Accordingly, in each set of subframes (e.g., of a quantity m), a part of a TB may occur in the same subframe occasion, such that the parts of the TB occur periodically (e.g., the interleaving pattern and/or the deinterleaving pattern may be a regular pattern). In some aspects, an interleaving pattern and/or a deinterleaving pattern that repeats in each set of subframes of the plurality of subframes (e.g., of a quantity m×n) may be determined according to Equation 1:

$$I_{TB}(j) = (j+j_0) \text{ modulo } m \qquad \text{Equation 1}$$

where j represents a subframe to which a part of a TB is mapped, $j \in \{0, 1, \ldots, (m \times n)-1\}$, $I_{TB}(j)$ represents a TB part having an index I at a jth subframe, and $j_0$ represents an offset (e.g., to cause a cyclic shift of the interleaving pattern and/or the deinterleaving pattern at each set of subframes).

As shown by example 540, in some aspects, the interleaving pattern and/or the deinterleaving pattern may be different in each set of subframes of the plurality of subframes (e.g., of a quantity m×n). In such a case, a quantity of subframes in a set of subframes may correspond to the quantity of the plurality of TBs (m). Accordingly, in each set of subframes (e.g., of a quantity m), a part of a TB may occur in a different subframe occasion, such that the parts of the TB occur aperiodically (e.g., the interleaving pattern and/or the deinterleaving pattern may be an irregular pattern). In some aspects, an interleaving pattern and/or a deinterleaving pattern that is different in each set of subframes of the plurality of subframes (e.g., of a quantity m×n) may be determined according to Equation 2:

$$I_{TB}(j) = \Pi^{\lfloor \frac{j}{m} \rfloor}((j + j_0) \text{ modulo } m) \qquad \text{Equation 2}$$

where j represents a subframe to which a part of a TB is mapped, $j \in \{0, 1, \ldots, (m \times n)-1\}$, $I_{TB}(j)$ represents a TB part having an index I at a jth subframe, $j_0$ represents an offset (e.g., to cause a cyclic shift of the interleaving pattern and/or the deinterleaving pattern at each set of subframes), $$\Pi^{\lfloor \frac{j}{m} \rfloor}$$

represents a permutation of the set $\{1, 2, \ldots, m\}$ in a set of subframes H having an index of the floor of $$\frac{j}{m}, \text{ and } \frac{j}{m} \in \{0, 1, \ldots, n-1\}.$$

In some aspects, one or more parameters of Equation 1 or Equation 2, such as $j_0$, may be configured by multicast scheduling information (MSI) (e.g., in a medium access control (MAC) control element (CE)).

As indicated above, FIGS. 5A and 5B are provided as one or more examples. Other examples may differ from what is described with respect to FIGS. 5A and 5B.

Figure 6:
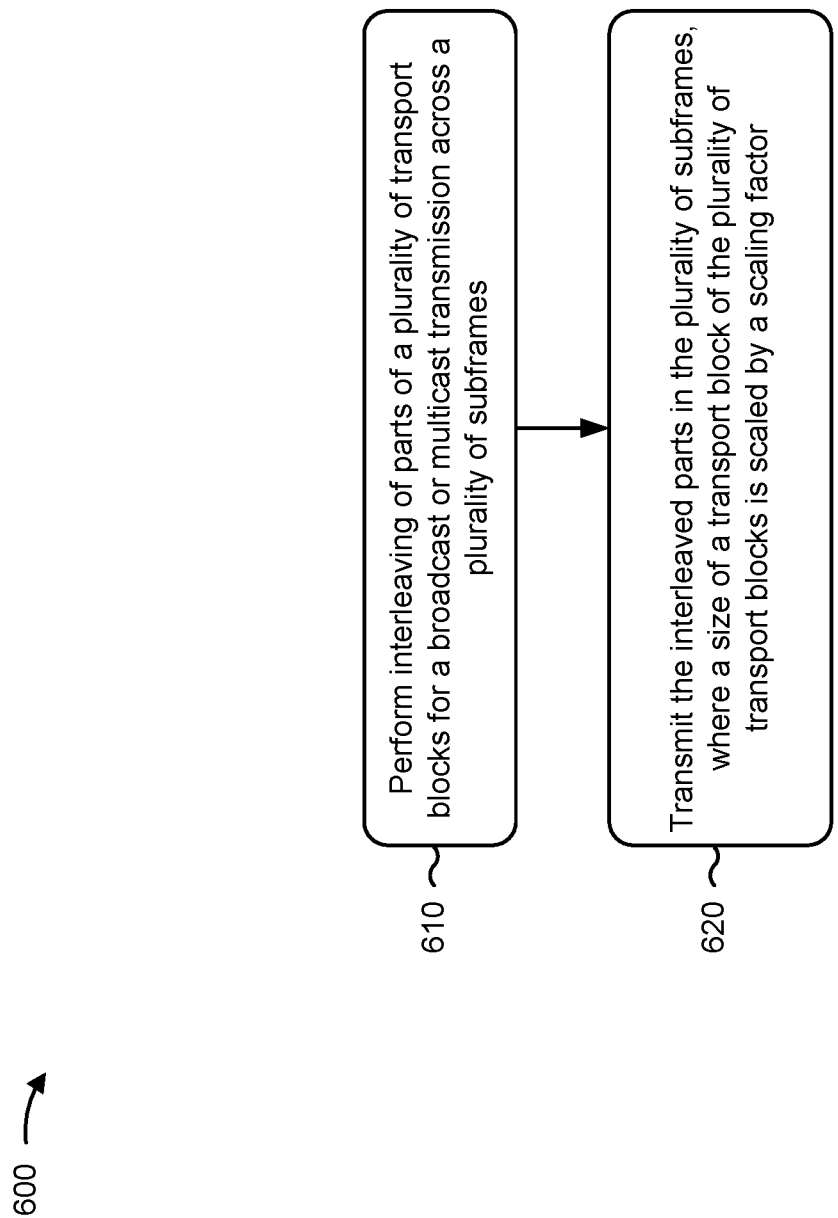
FIG. 6 is a diagram illustrating an example process performed, for example, by a base station, in accordance with various aspects of the present disclosure.

FIG. 6 is a diagram illustrating an example process 600 performed, for example, by a base station, in accordance with various aspects of the present disclosure. Example process 600 is an example where a base station (e.g., BS 110, and/or the like) performs operations associated with interleaving transport blocks in broadcast transmissions.

As shown in FIG. 6, in some aspects, process 600 may include performing interleaving of parts of a plurality of transport blocks for a broadcast or multicast transmission across a plurality of time intervals (block 610). For example, the base station (e.g., using controller/processor 240, and/or the like) may perform interleaving of parts of a plurality of transport blocks for a broadcast or multicast transmission across a plurality of time intervals, as described above.

As further shown in FIG. 6, in some aspects, process 600 may include transmitting the interleaved parts in the plurality of time intervals, where a size of a transport block of the plurality of transport blocks is scaled by a scaling factor (block 620). For example, the base station (e.g., using controller/processor 240, transmit processor 220, TX MIMO processor 230, MOD 232, antenna 234, and/or the like) may transmit the interleaved parts in the plurality of time intervals. In some aspects, a size of a transport block of the plurality of transport blocks is scaled by a scaling factor, as described above.

Process 600 may include additional aspects, such as any single aspect or any combination of aspects described below and/or in connection with one or more other processes described elsewhere herein.

In a first aspect, the plurality of transport blocks are associated with a broadcast transmission.

In a second aspect, alone or in combination with the first aspect, process 600 further includes performing rate matching of bits of each transport block of the plurality of transport blocks to resource elements for multiple time intervals of the plurality of time intervals.

In a third aspect, alone or in combination with one or more of the first and second aspects, process 600 further includes performing interleaving of respective bits of the plurality of transport blocks. In a fourth aspect, alone or in combination with one or more of the first through third aspects, interleaving of the respective bits is performed according to an interleaving procedure that is based at least in part on a bandwidth of a broadcast system. In a fifth aspect, alone or in combination with one or more of the first through fourth aspects, interleaving of the respective bits is performed per bit or per a set of bits.

In a sixth aspect, alone or in combination with one or more of the first through fifth aspects, the parts of the transport block of the plurality of transport blocks are mapped to multiple time intervals of the plurality of time intervals, and each of the parts of the transport block correspond to multiple subsets of coded bits respectively corresponding to codeblocks of the transport block. In a seventh aspect, alone or in combination with one or more of the first through sixth aspects, the multiple subsets of coded bits are stored in respective circular buffers corresponding to the codeblocks of the transport block.

In an eighth aspect, alone or in combination with one or more of the first through seventh aspects, a quantity of coded bits in the multiple subsets of coded bits corresponds to a quantity of available resource elements in a time interval of the multiple time intervals. In a ninth aspect, alone or in combination with one or more of the first through eighth aspects, the multiple subsets of coded bits identify a repetition of the transport block.

In a tenth aspect, alone or in combination with one or more of the first through ninth aspects, a starting pointer used to identify the multiple subsets of coded bits is the same for each of the codeblocks of the transport block. In an eleventh aspect, alone or in combination with one or more of the first through tenth aspects, first multiple subsets of coded bits mapped to a time interval of the multiple time intervals are identified using a starting pointer, and the starting pointer is incremented by one relative to an ending pointer used to identify second multiple subsets of coded bits mapped to a preceding time interval of the multiple time intervals. In a twelfth aspect, alone or in combination with one or more of the first through eleventh aspects, the ending pointer has a lowest value among ending pointers for the codeblocks of the transport block.

In a thirteenth aspect, alone or in combination with one or more of the first through twelfth aspects, the parts of a transport block of the plurality of transport blocks are mapped first to one or more resource elements of a time interval of multiple time intervals carrying the parts of the transport block and then to one or more resource elements of another time interval of the multiple time intervals.

In a fourteenth aspect, alone or in combination with one or more of the first through thirteenth aspects, the scaling factor corresponds to a quantity of time intervals that are to carry the parts of the transport block. In a fifteenth aspect, alone or in combination with one or more of the first through fourteenth aspects, a time interval of the plurality of time intervals carries a part of a single transport block of the plurality of transport blocks.

In a sixteenth aspect, alone or in combination with one or more of the first through fifteenth aspects, interleaving of the parts is performed for symbols of the plurality of time intervals that are assigned to data traffic.

In a seventeenth aspect, alone or in combination with one or more of the first through sixteenth aspects, interleaving of the parts is performed according to an interleaving pattern. In an eighteenth aspect, alone or in combination with one or more of the first through seventeenth aspects, interleaving of the parts is performed according to an interleaving pattern that repeats in each set of time intervals of the plurality of time intervals, and a quantity of time intervals in a set of time intervals corresponds to a quantity of the plurality of transport blocks. In a nineteenth aspect, alone or in combination with one or more of the first through eighteenth aspects, interleaving of the parts is performed according to an interleaving pattern that is different in each set of time intervals of the plurality of time intervals, and a quantity of time intervals in a set of time intervals corresponds to a quantity of the plurality of transport blocks.

In a twentieth aspect, alone or in combination with one or more of the first through nineteenth aspects, process 600 further includes transmitting a configuration that identifies at least one of a quantity of the plurality of transport blocks or a quantity of time intervals that carry the parts of a transport block of the plurality of transport blocks. In a twenty first aspect, alone or in combination with one or more of the first through twentieth aspects, the configuration is transmitted in a system information block, a broadcast control channel, or broadcast scheduling information. In a twenty second aspect, alone or in combination with one or more of the first through twenty first aspects, the configuration is based at least in part on a bandwidth of a broadcast system.

Although FIG. 6 shows example blocks of process 600, in some aspects, process 600 may include additional blocks, fewer blocks, different blocks, or differently arranged blocks than those depicted in FIG. 6. Additionally, or alternatively, two or more of the blocks of process 600 may be performed in parallel.

Figure 7:
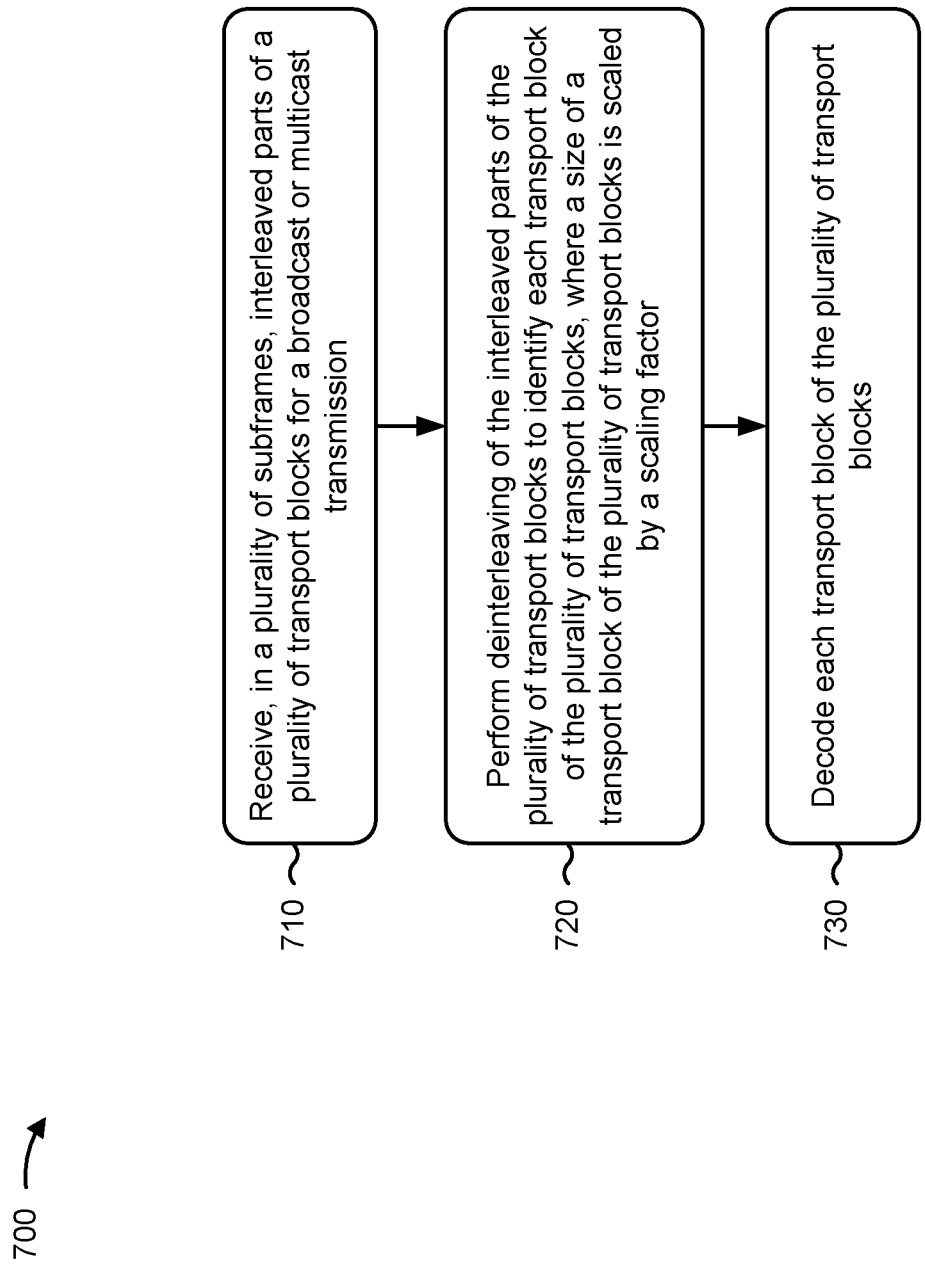
FIG. 7 is a diagram illustrating an example process performed, for example, by a user equipment, in accordance with various aspects of the present disclosure.

FIG. 7 is a diagram illustrating an example process 700 performed, for example, by a UE, in accordance with various aspects of the present disclosure. Example process 700 is an example where a UE (e.g., UE 120, and/or the like) performs operations associated with interleaving transport blocks in broadcast transmissions.

As shown in FIG. 7, in some aspects, process 700 may include receiving, in a plurality of time intervals, interleaved parts of a plurality of transport blocks for a broadcast or multicast transmission (block 710). For example, the UE (e.g., using antenna 252, DEMOD 254, MIMO detector 256, receive processor 258, controller/processor 280, and/or the like) may receive, in a plurality of time intervals, interleaved parts of a plurality of transport blocks for a broadcast or multicast transmission, as described above.

As further shown in FIG. 7, in some aspects, process 700 may include performing deinterleaving of the interleaved parts of the plurality of transport blocks to identify each transport block of the plurality of transport blocks, where a size of a transport block of the plurality of transport blocks is scaled by a scaling factor (block 720). For example, the UE (e.g., using controller/processor 280, and/or the like) may perform deinterleaving of the interleaved parts of the plurality of transport blocks to identify each transport block of the plurality of transport blocks. In some aspects, a size of a transport block of the plurality of transport blocks is scaled by a scaling factor, as described above.

As further shown in FIG. 7, in some aspects, process 700 may include decoding each transport block of the plurality of transport blocks (block 730). For example, the UE (e.g., using controller/processor 280, and/or the like) may decode each transport block of the plurality of transport blocks, as described above.

Process 700 may include additional aspects, such as any single aspect or any combination of aspects described below and/or in connection with one or more other processes described elsewhere herein.

In a first aspect, the plurality of transport blocks are associated with a broadcast transmission.

In a second aspect, alone or in combination with the first aspect, decoding each transport block of the plurality of transport blocks includes performing de-rate matching of bits of each transport block of the plurality of transport blocks from resource elements for multiple time intervals of the plurality of time intervals. In a third aspect, alone or in combination with one or more of the first and second aspects, decoding each transport block of the plurality of transport blocks includes performing deinterleaving of respective bits of the plurality of transport blocks. In a fourth aspect, alone or in combination with one or more of the first through third aspects, deinterleaving of the respective bits is performed according to a deinterleaving procedure that is based at least in part on a bandwidth of a broadcast system. In a fifth aspect, alone or in combination with one or more of the first through fourth aspects, deinterleaving of the respective bits is performed per bit or per a set of bits.

In a sixth aspect, alone or in combination with one or more of the first through fifth aspects, the parts of the transport block of the plurality of transport blocks are mapped to multiple time intervals of the plurality of time intervals, and each of the parts of the transport block correspond to multiple subsets of coded bits respectively corresponding to codeblocks of the transport block. In a seventh aspect, alone or in combination with one or more of the first through sixth aspects, the multiple subsets of coded bits are associated with respective circular buffers corresponding to the codeblocks of the transport block.

In an eighth aspect, alone or in combination with one or more of the first through seventh aspects, a quantity of coded bits in the multiple subsets of coded bits corresponds to a quantity of available resource elements in a time interval of the multiple time intervals. In a ninth aspect, alone or in combination with one or more of the first through eighth aspects, the multiple subsets of coded bits identify a repetitions of the transport block.

In a tenth aspect, alone or in combination with one or more of the first through ninth aspects, a starting pointer used to identify the multiple subsets of coded bits is the same for each of the codeblocks of the transport block. In an eleventh aspect, alone or in combination with one or more of the first through tenth aspects, first multiple subsets of coded bits mapped to a time interval of the multiple time intervals are identified using a starting pointer, and the starting pointer is incremented by one relative to an ending pointer used to identify second multiple subsets of coded bits mapped to a preceding time interval of the multiple time intervals. In a twelfth aspect, alone or in combination with one or more of the first through eleventh aspects, the ending pointer has a lowest value among ending pointers for the codeblocks of the transport block.

In a thirteenth aspect, alone or in combination with one or more of the first through twelfth aspects, the parts of a transport block of the plurality of transport blocks are mapped first to one or more resource elements of a time interval of multiple time intervals carrying the parts of the transport block and then to one or more resource elements of another time interval of the multiple time intervals.

In a fourteenth aspect, alone or in combination with one or more of the first through thirteenth aspects, the scaling factor corresponds to a quantity of time intervals that are to carry the parts of the transport block. In a fifteenth aspect, alone or in combination with one or more of the first through fourteenth aspects, a time interval of the plurality of time intervals carries a part of a single transport block of the plurality of transport blocks.

In a sixteenth aspect, alone or in combination with one or more of the first through fifteenth aspects, deinterleaving of the parts is performed for symbols of the plurality of time intervals that are assigned to data traffic.

In a seventeenth aspect, alone or in combination with one or more of the first through sixteenth aspects, deinterleaving of the parts is performed according to a deinterleaving pattern. In an eighteenth aspect, alone or in combination with one or more of the first through seventeenth aspects, deinterleaving of the parts is performed according to a deinterleaving pattern that repeats in each set of time intervals of the plurality of time intervals, and a quantity of time intervals in a set of time intervals corresponds to a quantity of the plurality of transport blocks. In a nineteenth aspect, alone or in combination with one or more of the first through eighteenth aspects, deinterleaving of the parts is performed according to a deinterleaving pattern that is different in each set of time intervals of the plurality of time intervals, and a quantity of time intervals in a set of time intervals corresponds to a quantity of the plurality of transport blocks.

In a twentieth aspect, alone or in combination with one or more of the first through nineteenth aspects, process 700 further includes receiving a configuration that identifies at least one of a quantity of the plurality of transport blocks or a quantity of time intervals that carry the parts of a transport block of the plurality of transport blocks. In a twenty-first aspect, alone or in combination with one or more of the first through twentieth aspects, the configuration is received in a system information block, a broadcast control channel, or broadcast scheduling information. In a twenty-second aspect, alone or in combination with one or more of the first through twenty-first aspects, the configuration is based at least in part on a bandwidth of a broadcast system.

Although FIG. 7 shows example blocks of process 700, in some aspects, process 700 may include additional blocks, fewer blocks, different blocks, or differently arranged blocks than those depicted in FIG. 7. Additionally, or alternatively, two or more of the blocks of process 700 may be performed in parallel.

Figure 8:
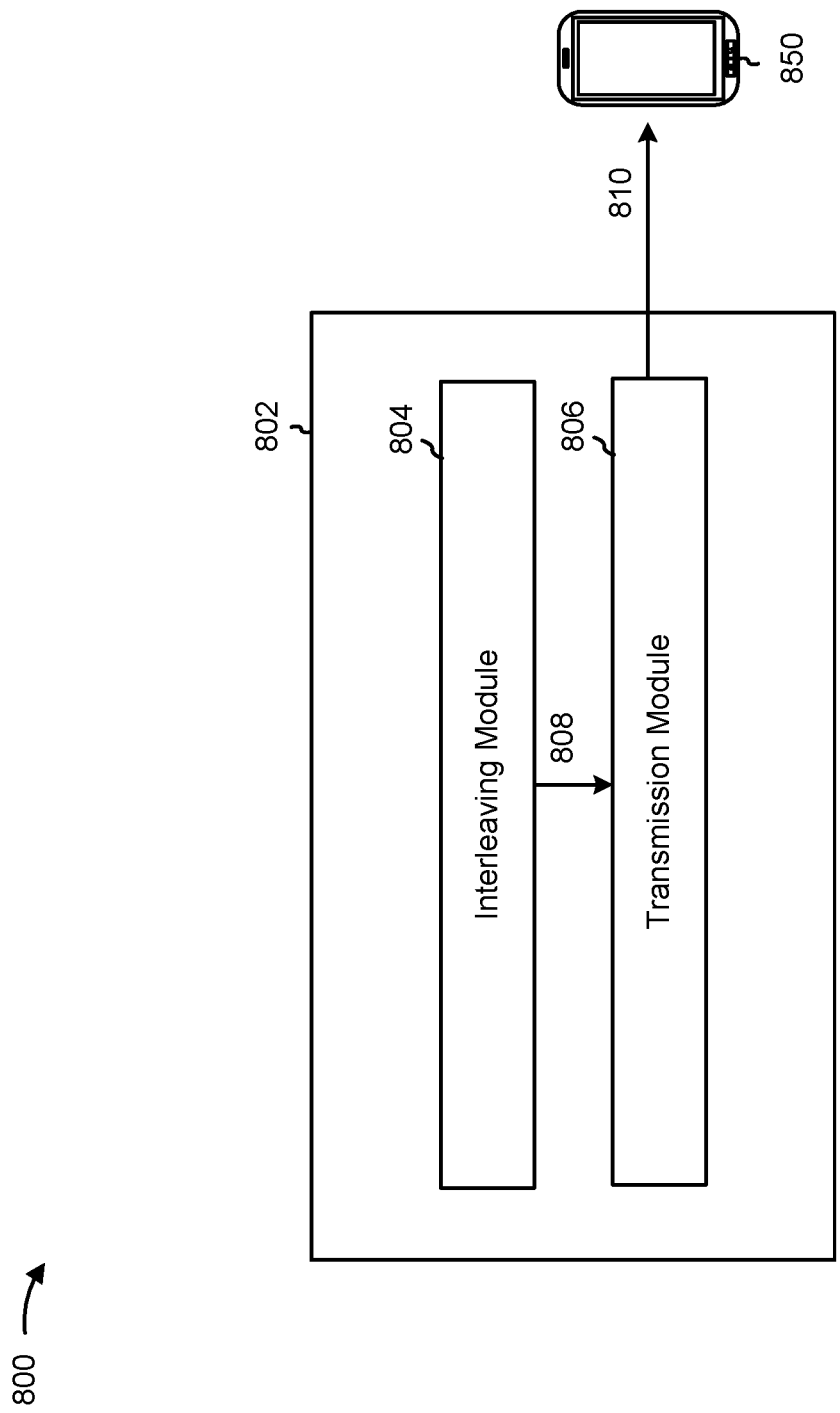
FIG. 8 is a diagram illustrating data flow between different modules/means/components in an example apparatus.

FIG. 8 is a diagram illustrating an example 800 of a data flow between different modules/means/components in an example apparatus 802. The apparatus 802 may be a base station. In some aspects, the apparatus 802 includes an interleaving module 804, a transmission module 806, and/or the like.

The interleaving module 804 may interleave parts of a plurality of TBs across a plurality of time intervals. The interleaving module 804 may provide data 808, such as the interleaved parts, to the transmission module 806. The transmission module 806 may transmit data 810, such as the interleaved parts, to the UE 850.

The apparatus may include additional modules that perform each of the blocks of the algorithm in the aforementioned flowchart of FIG. 6. Each block in the aforementioned flow chart of FIG. 6 may be performed by a module and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

The quantity and arrangement of modules shown in FIG. 8 are provided as an example. In practice, there may be additional modules, fewer modules, different modules, or differently arranged modules than those shown in FIG. 8. Furthermore, two or more modules shown in FIG. 8 may be implemented within a single module, or a single module shown in FIG. 8 may be implemented as multiple, distributed modules. Additionally, or alternatively, a set of modules (e.g., one or more modules) shown in FIG. 8 may perform one or more functions described as being performed by another set of modules shown in FIG. 8.

Figure 9:
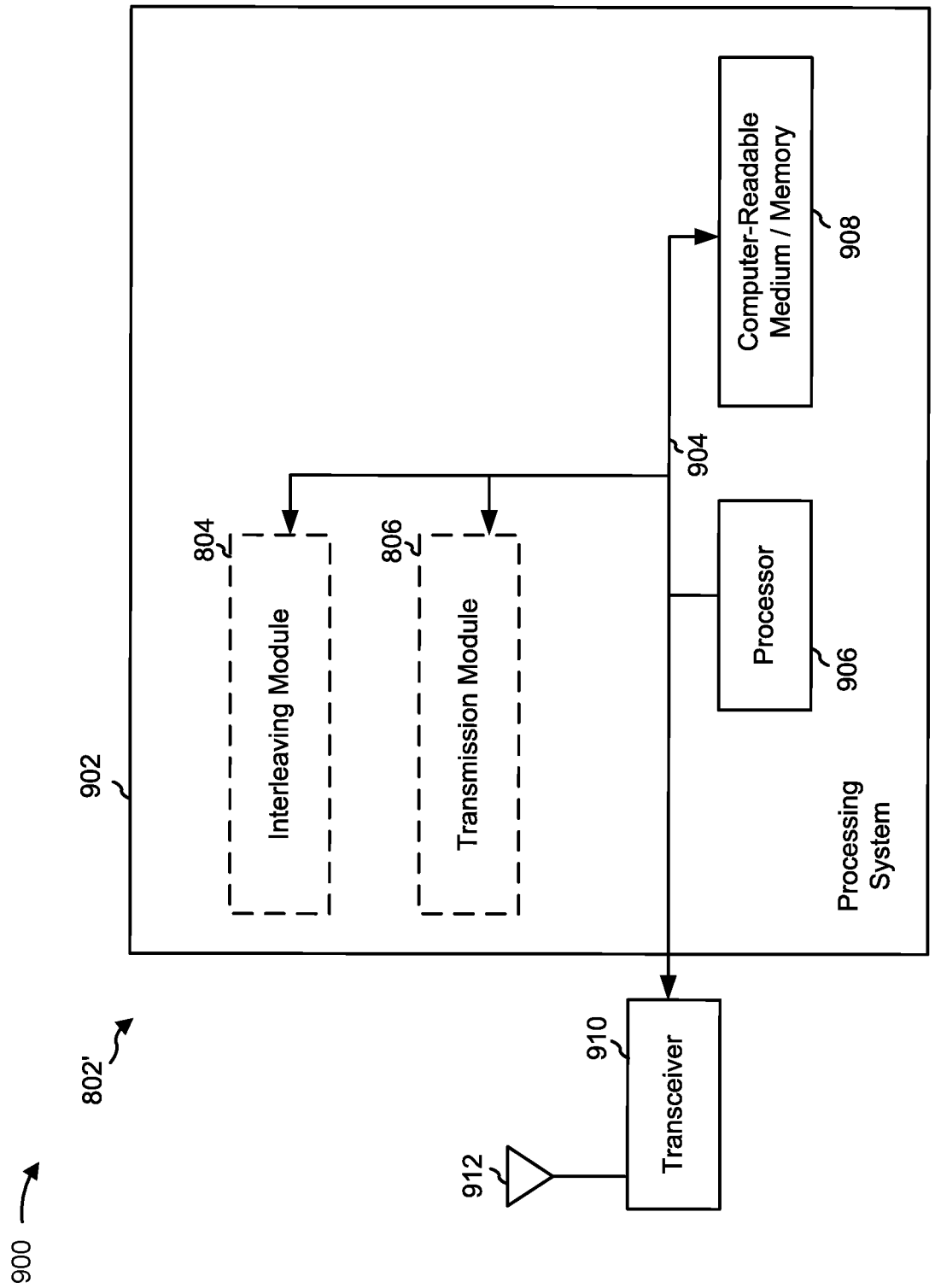
FIG. 9 is a diagram illustrating an example of a hardware implementation for an apparatus employing a processing system.

FIG. 9 is a diagram illustrating an example 900 of a hardware implementation for an apparatus 802' employing a processing system 902. The apparatus 802' may be a base station.

The processing system 902 may be implemented with a bus architecture, represented generally by the bus 904. The bus 904 may include any number of interconnecting buses and bridges depending on the specific application of the processing system 902 and the overall design constraints. The bus 904 links together various circuits including one or more processors and/or hardware modules, represented by the processor 906, the modules 804 and/or 806, and the computer-readable medium/memory 908. The bus 904 may also link various other circuits such as timing sources, peripherals, voltage regulators, and power management circuits, which are well known in the art, and therefore, will not be described any further.

The processing system 902 may be coupled to a transceiver 910. The transceiver 910 is coupled to one or more antennas 912. The transceiver 910 provides a means for communicating with various other apparatuses over a transmission medium. The transceiver 910 receives a signal from the one or more antennas 912, extracts information from the received signal, and provides the extracted information to the processing system 902. In addition, the transceiver 910 receives information from the processing system 902, specifically the transmission module 806, and based at least in part on the received information, generates a signal to be applied to the one or more antennas 912. The processing system 902 includes a processor 906 coupled to a computer-readable medium/memory 908. The processor 906 is responsible for general processing, including the execution of software stored on the computer-readable medium/memory 908. The software, when executed by the processor 906, causes the processing system 902 to perform the various functions described herein for any particular apparatus. The computer-readable medium/memory 908 may also be used for storing data that is manipulated by the processor 906 when executing software. The processing system further includes at least one of the modules 804 and/or 806. The modules may be software modules running in the processor 906, resident/stored in the computer readable medium/memory 908, one or more hardware modules coupled to the processor 906, or some combination thereof. The processing system 902 may be a component of the base station 110 and may include the memory 242 and/or at least one of the transmit processor 220, TX MIMO processor 230, and/or the controller/processor 240.

In some aspects, the apparatus 802/802' for wireless communication includes means for performing interleaving of parts of a plurality of transport blocks across a plurality of time intervals, means for transmitting the interleaved parts in the plurality of time intervals, and/or the like. The aforementioned means may be one or more of the aforementioned modules of the apparatus 802 and/or the processing system 902 of the apparatus 802' configured to perform the functions recited by the aforementioned means. As described above, the processing system 902 may include the transmit processor 220, TX MIMO processor 230, and/or the controller/processor 240. Consequently, in one configuration, the aforementioned means may be the transmit processor 220, TX MIMO processor 230, and/or the controller/processor 240 configured to perform the functions recited by the aforementioned means.

FIG. 9 is provided as an example. Other examples are possible and may differ from what was described in connection with FIG. 9.

Figure 10:
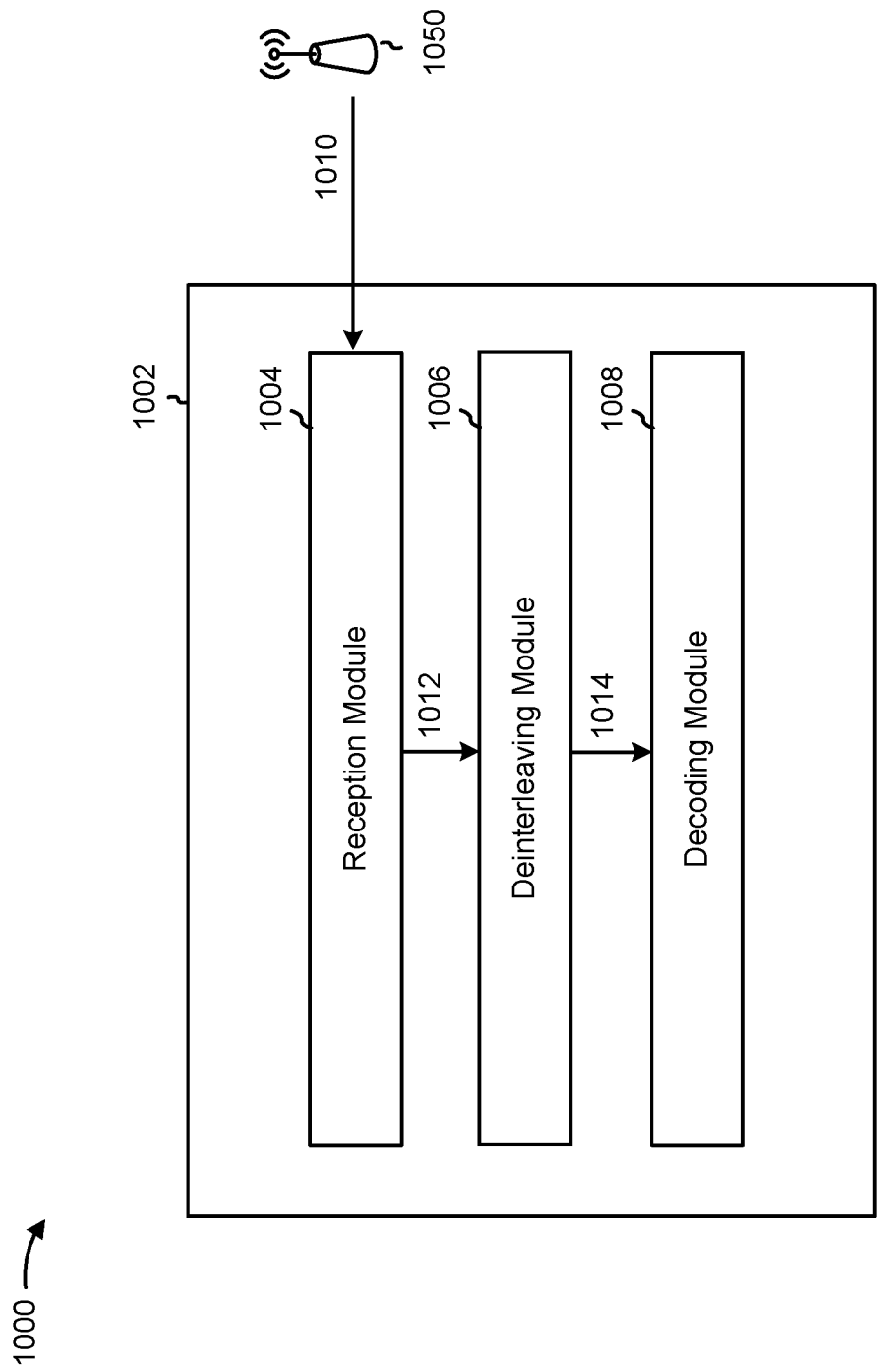
FIG. 10 is a diagram illustrating data flow between different modules/means/components in another example apparatus.

FIG. 10 is a diagram illustrating an example 1000 of a data flow between different modules/means/components in an example apparatus 1002. The apparatus 1002 may be a UE. In some aspects, the apparatus 1002 includes a reception module 1004, a deinterleaving module 1006, a decoding module 1008, and/or the like.

The reception module 1004 may receive data 1010, such as interleaved parts of a plurality of TBs, from a base station 1050. The reception module 1004 may provide data 1012, such as the interleaved parts, to the deinterleaving module 1006. The deinterleaving module 1006 may deinterleave the interleaved parts of the plurality of TBs to identify each TB of the plurality of TBs. The deinterleaving module 1006 may provide data 1014 to the decoding module 1008. The decoding module 1008 may decode each TB of the plurality of TBs.

The apparatus may include additional modules that perform each of the blocks of the algorithm in the aforementioned flow chart of FIG. 7. Each block in the aforementioned flow chart of FIG. 7 may be performed by a module and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

The quantity and arrangement of modules shown in FIG. 10 are provided as an example. In practice, there may be additional modules, fewer modules, different modules, or differently arranged modules than those shown in FIG. 10. Furthermore, two or more modules shown in FIG. 10 may be implemented within a single module, or a single module shown in FIG. 10 may be implemented as multiple, distributed modules. Additionally, or alternatively, a set of modules (e.g., one or more modules) shown in FIG. 10 may perform one or more functions described as being performed by another set of modules shown in FIG. 10.

Figure 11:
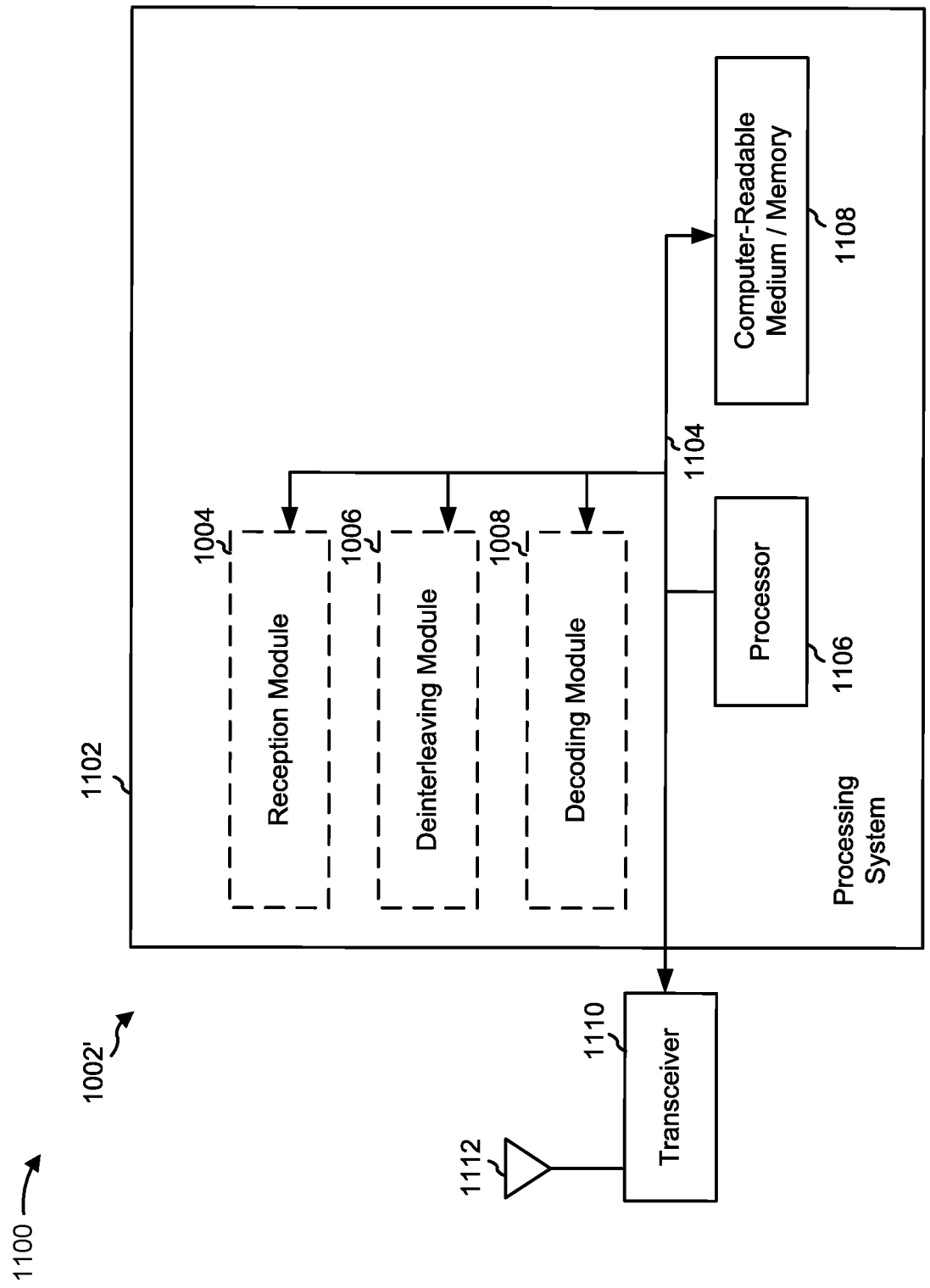
FIG. 11 is a diagram illustrating an example of a hardware implementation for an apparatus employing a processing system.

FIG. 11 is a diagram illustrating an example 1100 of a hardware implementation for an apparatus 1002' employing a processing system 1102. The apparatus 1002' may be a UE.

The processing system 1102 may be implemented with a bus architecture, represented generally by the bus 1104. The bus 1104 may include any number of interconnecting buses and bridges depending on the specific application of the processing system 1102 and the overall design constraints. The bus 1104 links together various circuits including one or more processors and/or hardware modules, represented by the processor 1106, the modules 1004, 1006, and/or 1008, and the computer-readable medium/memory 1108. The bus 1104 may also link various other circuits such as timing sources, peripherals, voltage regulators, and power management circuits, which are well known in the art, and therefore, will not be described any further.

The processing system 1102 may be coupled to a transceiver 1110. The transceiver 1110 is coupled to one or more antennas 1112. The transceiver 1110 provides a means for communicating with various other apparatus over a transmission medium. The transceiver 1110 receives a signal from the one or more antennas 1112, extracts information from the received signal, and provides the extracted information to the processing system 1102, specifically the reception module 1004. In addition, the transceiver 1110 receives information from the processing system 1102, and based at least in part on the received information, generates a signal to be applied to the one or more antennas 1112. The processing system 1102 includes a processor 1106 coupled to a computer-readable medium/memory 1108. The processor 1106 is responsible for general processing, including the execution of software stored on the computer-readable medium/memory 1108. The software, when executed by the processor 1106, causes the processing system 1102 to perform the various functions described herein for any particular apparatus. The computer-readable medium/memory 1108 may also be used for storing data that is manipulated by the processor 1106 when executing software. The processing system further includes at least one of the modules 1004, 1006, and/or 1008. The modules may be software modules running in the processor 1106, resident/stored in the computer readable medium/memory 1108, one or more hardware modules coupled to the processor 1106, or some combination thereof. The processing system 1102 may be a component of the UE 120 and may include the memory 282 and/or at least one of the receive processor 258 and/or the controller/processor 280.

In some aspects, the apparatus 1002/1002' for wireless communication includes means for receiving, in a plurality of time intervals, interleaved parts of a plurality of transport blocks, means for performing deinterleaving of the interleaved parts of the plurality of transport blocks to identify each transport block of the plurality of transport blocks, means for decoding each transport block of the plurality of transport blocks, and/or the like. The aforementioned means may be one or more of the aforementioned modules of the apparatus 1002 and/or the processing system 1102 of the apparatus 1002' configured to perform the functions recited by the aforementioned means. As described above, the processing system 1102 may include the receive processor 258 and/or the controller/processor 280. Consequently, in one configuration, the aforementioned means may be the receive processor 258 and/or the controller/processor 280 configured to perform the functions recited by the aforementioned means.

FIG. 11 is provided as an example. Other examples are possible and may differ from what was described in connection with FIG. 11.

The foregoing disclosure provides illustration and description, but is not intended to be exhaustive or to limit the aspects to the precise form disclosed. Modifications and variations may be made in light of the above disclosure or may be acquired from practice of the aspects.

As used herein, the term "component" is intended to be broadly construed as hardware, firmware, and/or a combination of hardware and software. As used herein, a processor is implemented in hardware, firmware, and/or a combination of hardware and software.

As used herein, satisfying a threshold may, depending on the context, refer to a value being greater than the threshold, greater than or equal to the threshold, less than the threshold, less than or equal to the threshold, equal to the threshold, not equal to the threshold, and/or the like.

It will be apparent that systems and/or methods described herein may be implemented in different forms of hardware, firmware, and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A method of wireless communication performed by a base station, comprising:
    performing interleaving of parts of a plurality of transport blocks for a broadcast or multicast transmission across a plurality of time intervals,
        wherein a size of a transport block of the plurality of transport blocks is scaled by a scaling factor,
        wherein particular parts of the transport block are mapped to multiple time intervals of the plurality of time intervals,
        wherein the parts of the plurality of transport blocks include the particular parts of the transport block,
        wherein a part, of the particular parts of the transport block, corresponds to multiple subsets of coded bits respectively corresponding to codeblocks of the transport block, and
        wherein the multiple subsets of coded bits are stored in respective circular buffers corresponding to the codeblocks of the transport block; and
    transmitting the interleaved parts in the plurality of time intervals.

2. The method of claim 1, further comprising:
    performing rate matching of bits of the transport block to resource elements for the multiple time intervals.

3. The method of claim 1, further comprising:
    performing interleaving of respective bits of the plurality of transport blocks.

4. The method of claim 1, wherein a quantity of coded bits in the multiple subsets of coded bits corresponds to a quantity of available resource elements in a time interval of the multiple time intervals.

5. The method of claim 1, wherein the multiple subsets of coded bits identify a repetition of the transport block.

6. The method of claim 1, wherein a starting pointer used to identify the multiple subsets of coded bits is the same for each of the codeblocks of the transport block.

7. The method of claim 1, wherein first multiple subsets of coded bits, of the multiple subsets of coded bits, mapped to a time interval of the multiple time intervals are identified using a starting pointer, and
    wherein the starting pointer is incremented by one relative to an ending pointer used to identify second multiple subsets of coded bits, the multiple subsets of coded bits, mapped to a preceding time interval of the multiple time intervals.

8. The method of claim 7, wherein the ending pointer has a lowest value among ending pointers for the codeblocks of the transport block.

9. The method of claim 1, wherein the scaling factor corresponds to a quantity of the plurality of time intervals.

10. The method of claim 1, wherein the interleaving of the parts is performed according to an interleaving pattern that repeats in each set of time intervals of the plurality of time intervals, and
    wherein a quantity of time intervals in a set of time intervals corresponds to a quantity of the plurality of transport blocks.

11. The method of claim 1, wherein the interleaving of the parts is performed according to an interleaving pattern that is different in each set of time intervals of the plurality of time intervals, and
    wherein a quantity of time intervals in a set of time intervals corresponds to a quantity of the plurality of transport blocks.

12. A method of wireless communication performed by a user equipment (UE), comprising:
    receiving, in a plurality of time intervals, interleaved parts of a plurality of transport blocks for a broadcast or multicast transmission;
    performing deinterleaving of the interleaved parts of the plurality of transport blocks to identify each transport block of the plurality of transport blocks,
        wherein a size of a transport block of the plurality of transport blocks is scaled by a scaling factor,
        wherein particular parts of the transport block are mapped to multiple time intervals of the plurality of time intervals,
        wherein the parts of the plurality of transport blocks include the particular parts of the transport block,
        wherein a part, of the particular parts of the transport block, corresponds to multiple subsets of coded bits respectively corresponding to codeblocks of the transport block, and
        wherein the multiple subsets of coded bits are stored in respective circular buffers corresponding to the codeblocks of the transport block; and
    decoding each transport block of the plurality of transport blocks.

13. The method of claim 12, wherein decoding each transport block of the plurality of transport blocks comprises:
    performing de-rate matching of bits of the transport block from resource elements for the multiple time intervals.

14. The method of claim 12, wherein decoding each transport block of the plurality of transport blocks comprises:
    performing deinterleaving of respective bits of the plurality of transport blocks.

15. The method of claim 12, wherein a quantity of coded bits in the multiple subsets of coded bits corresponds to a quantity of available resource elements in a time interval of the multiple time intervals.

16. The method of claim 12, wherein the multiple subsets of coded bits identify a repetition of the transport block.

17. The method of claim 12, wherein a starting pointer used to identify the multiple subsets of coded bits is the same for each of the codeblocks of the transport block.

18. The method of claim 12, wherein first multiple subsets of coded bits, of the multiple subsets of coded bits, mapped to a time interval of the multiple time intervals are identified using a starting pointer, and
    wherein the starting pointer is incremented by one relative to an ending pointer used to identify second multiple subsets of coded bits, the multiple subsets of coded bits, mapped to a preceding time interval of the multiple time intervals.

19. The method of claim 18, wherein the ending pointer has a lowest value among ending pointers for the codeblocks of the transport block.

20. The method of claim 12, wherein a time interval of the plurality of time intervals carries a part of a single transport block of the plurality of transport blocks.

21. The method of claim 12, wherein the deinterleaving of the parts is performed according to a deinterleaving pattern that repeats in each set of time intervals of the plurality of time intervals, and
wherein a quantity of time intervals in a set of time intervals corresponds to a quantity of the plurality of transport blocks.

22. The method of claim 12, wherein the deinterleaving of the parts is performed according to a deinterleaving pattern that is different in each set of time intervals of the plurality of time intervals, and
wherein a quantity of time intervals in a set of time intervals corresponds to a quantity of the plurality of transport blocks.

23. A network entity for wireless communication, comprising:
a memory; and
one or more processors, coupled to the memory, configured to:
perform interleaving of parts of a plurality of transport blocks for a broadcast or multicast transmission across a plurality of time intervals,
wherein a size of a transport block of the plurality of transport blocks is scaled by a scaling factor,
wherein particular parts of the transport block are mapped to multiple time intervals of the plurality of time intervals,
wherein the parts of the plurality of transport blocks include the particular parts of the transport block,
wherein a part, of the particular parts of the transport block, corresponds to multiple subsets of coded bits respectively corresponding to codeblocks of the transport block, and
wherein the multiple subsets of coded bits are stored in respective circular buffers corresponding to the codeblocks of the transport block; and
transmit the interleaved parts in the plurality of time intervals.

24. The network entity of claim 23, wherein a starting pointer used to identify the multiple subsets of coded bits is the same for each of the codeblocks of the transport block.

25. A user equipment (UE) for wireless communication, comprising:
a memory; and
one or more processors, coupled to the memory, configured to:
receive, in a plurality of time intervals, interleaved parts of a plurality of transport blocks for a broadcast or a multicast transmission;
perform deinterleaving of the interleaved parts of the plurality of transport blocks to identify each transport block of the plurality of transport blocks,
wherein a size of a transport block of the plurality of transport blocks is scaled by a scaling factor,
wherein particular parts of the transport block are mapped to multiple time intervals of the plurality of time intervals,
wherein the parts of the plurality of transport blocks include the particular parts of the transport block,
wherein a part, of the particular parts of the transport block, corresponds to multiple subsets of coded bits respectively corresponding to codeblocks of the transport block, and
wherein the multiple subsets of coded bits are stored in respective circular buffers corresponding to the codeblocks of the transport block; and
decode each transport block of the plurality of transport blocks.

26. The UE of claim 25, wherein the deinterleaving of the parts is performed according to a deinterleaving pattern, and
wherein the deinterleaving pattern is based on an equation comprising:

$$ITBj = (j+j0) \operatorname{modulo} m,$$

where j represents a time interval, of the plurality of time intervals, to which a transport block part, of the interleaved parts, is mapped,
wherein ITB(j) represents the transport block part, of the interleaved parts, having an index I at the jth time interval,
wherein j0 represents an offset, and
wherein m represents a quantity of the plurality of transport blocks.

27. The UE of claim 25, wherein the deinterleaving of the parts is performed according to a deinterleaving pattern, and
wherein the deinterleaving pattern is based on an equation comprising:

$$ITBj = \Pi jm(j+j0 \operatorname{modulo} m)$$

where j represents a time interval, of the plurality of time intervals, to which a transport block part, of the interleaved parts, is mapped,
wherein ITB(j) represents the transport block part having an index I at the jth time interval,
wherein j0 represents an offset,
wherein $\Pi jm$ represents a permutation of set 1, 2, . . . ,m in a set of subframes $\Pi$ having an index of a floor of jm, and jm∈0, 1, . . . ,n−1, and
wherein m represents a quantity of the plurality of transport blocks.

28. The UE of claim 25, wherein a starting pointer used to identify the multiple subsets of coded bits is the same for each of the codeblocks of the transport block.

* * * * *